United States Patent
Takeoka et al.

(10) Patent No.: US 11,264,145 B2
(45) Date of Patent: Mar. 1, 2022

(54) EXTENSIBLE ELECTROCONDUCTIVE WIRING MATERIAL, AND EXTENSIBLE ELECTROCONDUCTIVE WIRING MODULE HAVING SAME

(71) Applicant: ASAHI FR R&D CO., LTD., Saitama (JP)

(72) Inventors: Shinji Takeoka, Tokyo (JP); Toshinori Fujie, Tokyo (JP); Kento Yamagishi, Tokyo (JP); Hiroshi Takami, Saitama (JP); Masaru Azuma, Saitama (JP); Syo Mihara, Saitama (JP)

(73) Assignee: ASAHI FR R&D CO., LTD., Saitama (JP)

( * ) Notice: Subject to any disclaimer, the term of this patent is extended or adjusted under 35 U.S.C. 154(b) by 85 days.

(21) Appl. No.: 16/956,651

(22) PCT Filed: Dec. 14, 2018

(86) PCT No.: PCT/JP2018/046186
§ 371 (c)(1),
(2) Date: Jun. 22, 2020

(87) PCT Pub. No.: WO2019/124274
PCT Pub. Date: Jun. 27, 2019

(65) Prior Publication Data
US 2020/0411215 A1    Dec. 31, 2020

(30) Foreign Application Priority Data
Dec. 22, 2017   (JP) .............................. JP2017-246182

(51) Int. Cl.
*H01B 7/00*   (2006.01)
*H01B 7/06*   (2006.01)
(Continued)

(52) U.S. Cl.
CPC ................. *H01B 7/06* (2013.01); *H01B 7/04* (2013.01); *H01B 7/421* (2013.01)

(58) Field of Classification Search
CPC ......... H01B 7/06; H01B 7/04; H01B 167/421
See application file for complete search history.

(56) References Cited

U.S. PATENT DOCUMENTS 3,818,122 A * 6/1974 Luetzow .................. H01B 7/04
174/86
6,224,395 B1 * 5/2001 Dahlen .................. H05K 1/028
439/67

(Continued)

FOREIGN PATENT DOCUMENTS

JP    H06-140727 A    5/1994
JP    2006-294929 A   10/2006
(Continued)

OTHER PUBLICATIONS

Feb. 19, 2019 International Search Report issued in International Patent Application No. PCT/JP2018/046186.
(Continued)

*Primary Examiner* — Pete T Lee
(74) *Attorney, Agent, or Firm* — Oliff PLC

(57) ABSTRACT

An extensible electroconductive wiring material includes a flexible electroconductive material and insulating elastic bodies and, wherein the flexible electroconductive material having an electroconductive layer has vent peripheral edge portions in which vent holes and/or vent slits are penetrated and aligned in series and/or in parallel along an energization direction of the electroconductive layer while the vent peripheral edge portions are energizably linked, and the vent peripheral edge portions is sealed and covered by the insulating elastic bodies, so as not to be exposed; and the insulating elastic bodies, have penetration slits, and/or penetration holes which penetrate therethrough while matching (Continued)

the vent peripheral edge portions and are smaller than the vent holes and the vent slits. The extensible electroconductive wiring module has a plurality of these extensible electroconductive wiring materials.

19 Claims, 15 Drawing Sheets

(51) Int. Cl.
*H01B 7/04* (2006.01)
*H01B 7/42* (2006.01)

(56) References Cited

U.S. PATENT DOCUMENTS

| | | |
|---|---|---|
| 2015/0282295 A1 | 10/2015 | Matsumoto et al. |
| 2015/0282296 A1 | 10/2015 | Ogura et al. |
| 2017/0181276 A1 | 6/2017 | Sawada et al. |
| 2018/0009957 A1 | 1/2018 | Greco et al. |
| 2019/0327829 A1* | 10/2019 | Ogura ............... H05K 3/20 |

FOREIGN PATENT DOCUMENTS

| | | |
|---|---|---|
| JP | 2009-259929 A | 11/2009 |
| JP | 2015-198102 A | 11/2015 |
| JP | 2015-198103 A | 11/2015 |
| JP | 2017-118109 A | 6/2017 |
| WO | 2016/142850 A1 | 9/2016 |

OTHER PUBLICATIONS

Feb. 19, 2019 Written Opinion issued in International Patent Application No. PCT/JP2018/046186.

Ferry C. Shyu et al., "A kirigami approach to engineering elasticity in nanocomposites through patterned defects" Natural Materials, vol. 14, pp. 785-789, 2015.

Jul. 5, 2021 Extended European Search Report issued in European Patent Application No. 18893146.3.

* cited by examiner

Fig. 5
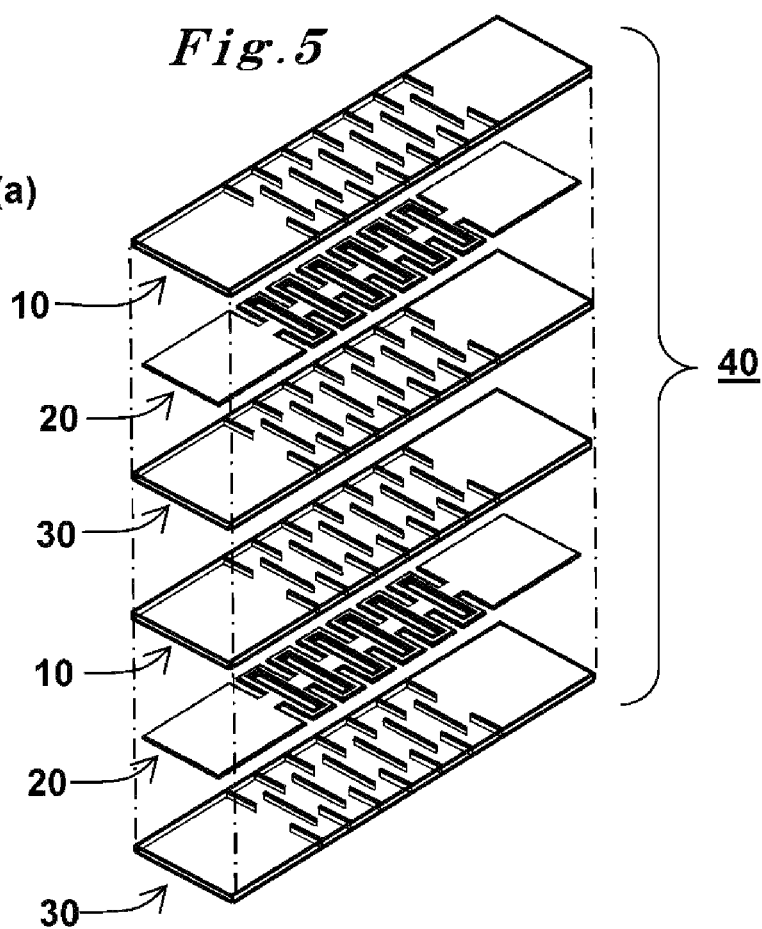
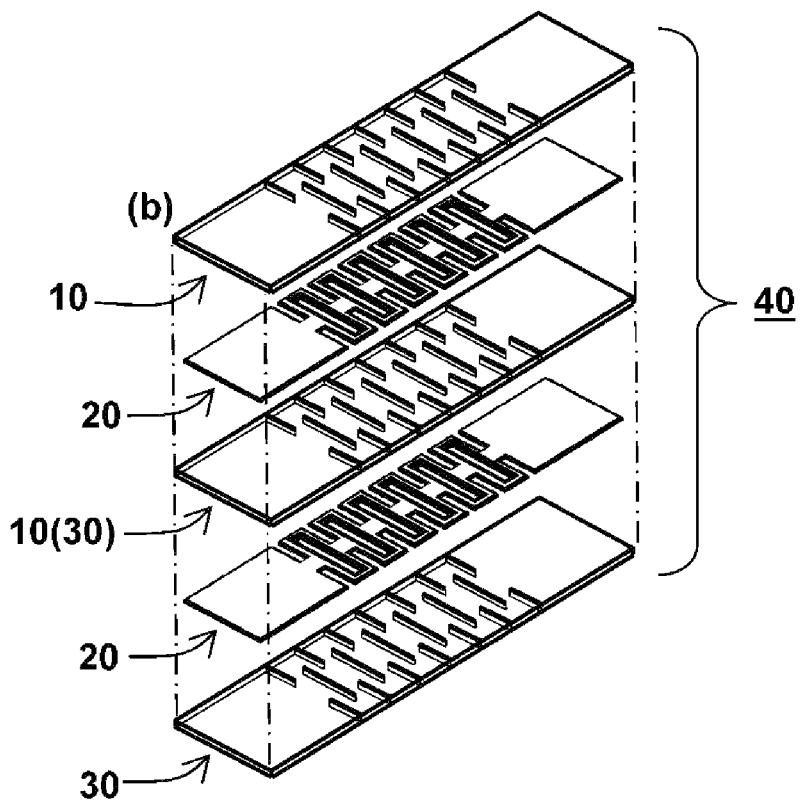

*Fig. 6*
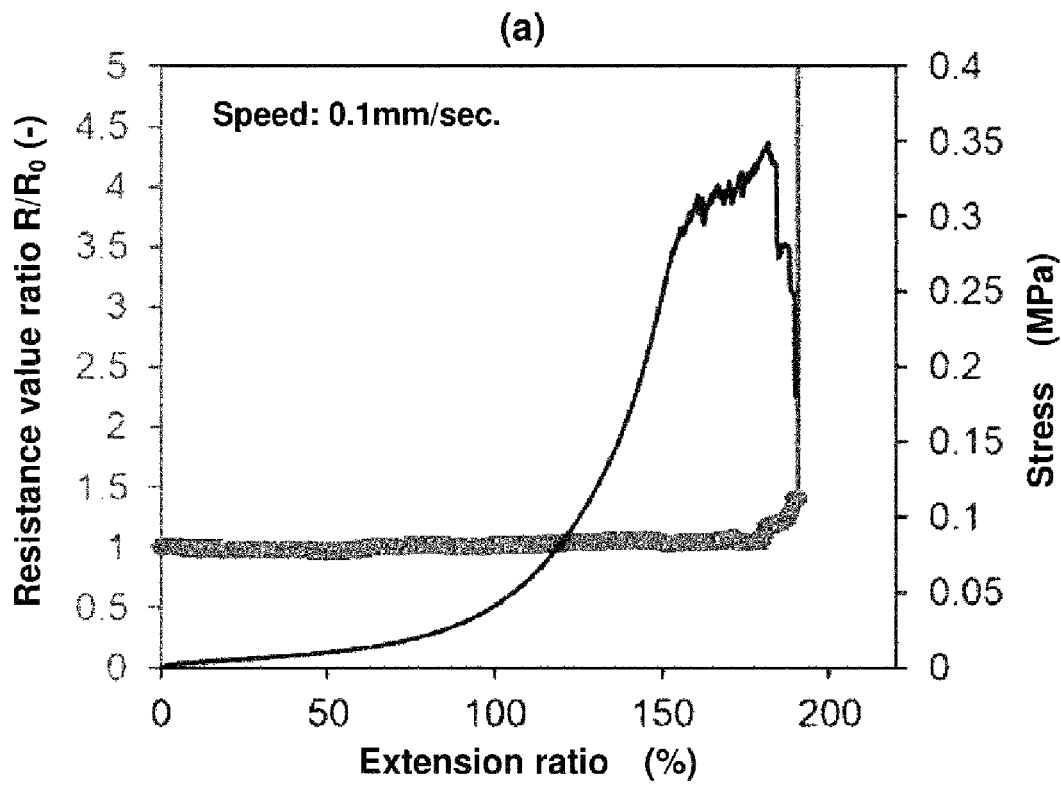
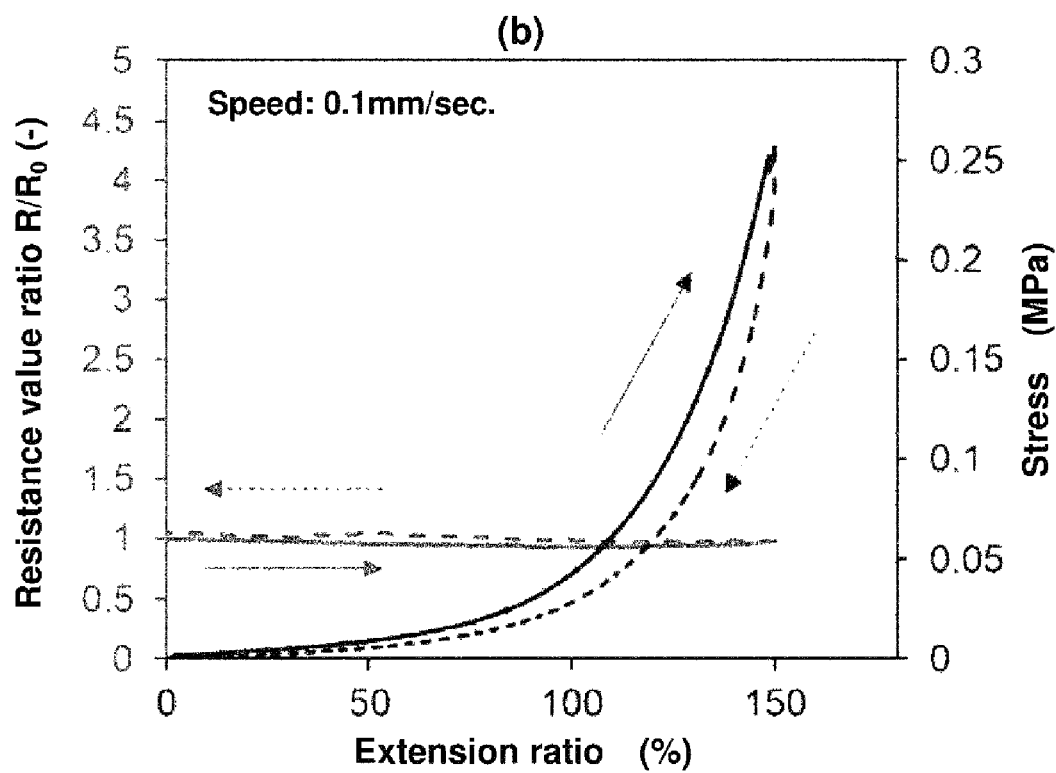

Fig. 8
0% ⟶ 150% ⟶ 0%
Example 1
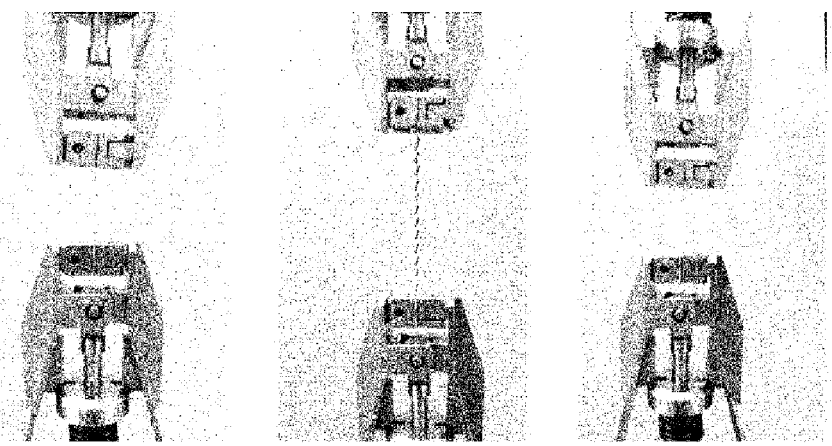
Comp. Example 2
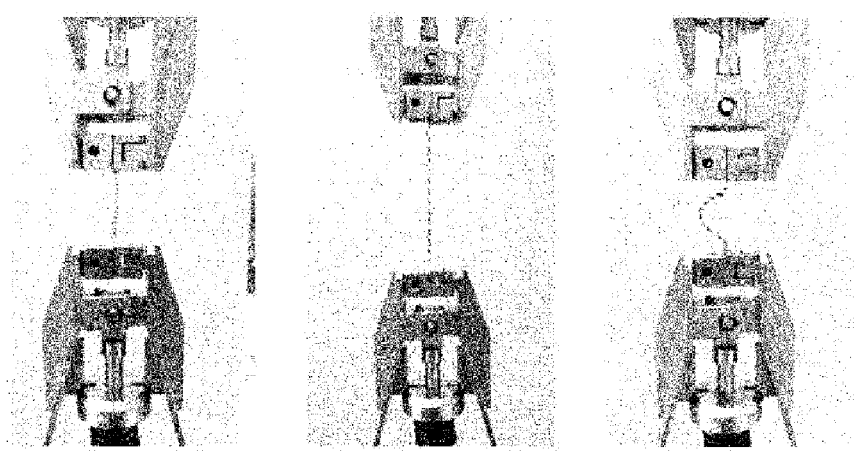

(a)$W_b$=1.50 (b)$W_b$=2.50 (c)$W_b$=2.50 (d)$W_b$=3.50 (e)$W_b$=4.00 (f)$W_b$=8.00(mm)

*Fig. 14*
(a) Before stretching    (b) In stretching    (c) After releasing
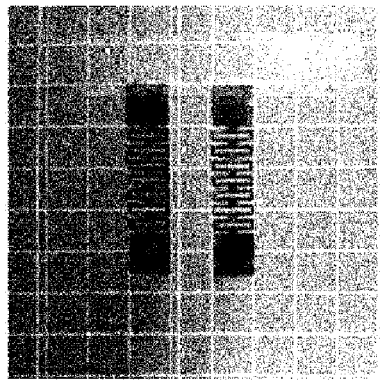 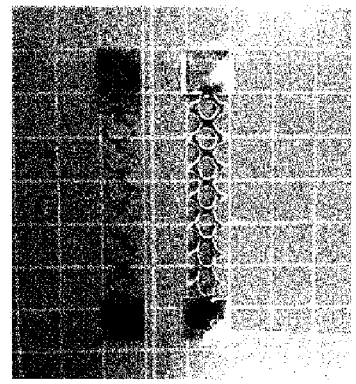 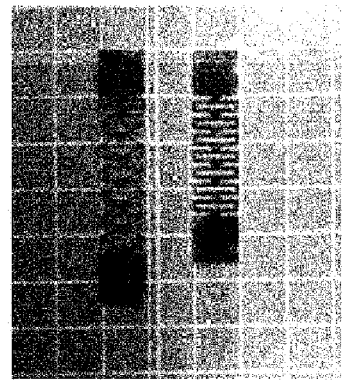

EXTENSIBLE ELECTROCONDUCTIVE WIRING MATERIAL, AND EXTENSIBLE ELECTROCONDUCTIVE WIRING MODULE HAVING SAME

TECHNICAL FIELD

The present invention is related to an extensible electroconductive wiring material which is used for wiring parts of a flexible device such as a wearable device and a flexible substrate etc., and related to an extensible electroconductive wiring module having same.

BACKGROUND OF THE ART

In electronic devices of prior arts, electronic parts such as IC chips have installed on a rigid silicon substrate or a glass substrate etc. with wirings. Recently, it have been demanded that the electric devices have flexibility and elasticity with also weight reduction, downsizing and miniaturization.

Electric devices such as wearable devices, medical devices and physical ability measurement devices have been used for flexible electronic devices having flexible wiring materials or a wiring substrates etc. which can follow movement of a living body. A flexible electronic device, in which a rubber ingredient composition is applied or an electroconductive rubber layer is attached onto an elastic film, is exemplified.

As regards a film having conductivity for a flexible electronic device, Patent Document 1 discloses: a process for the preparation of free-standing films, comprising at least a surface layer of a conductive polymer, said process being characterised in that it comprises the following steps:
a) deposition of a layer of a first polymer on a temporary support, wherein said deposition is carried out by the roll-to-roll technique staring from said temporary support in the form of a film and from a solution of said first polymer, and drying of the so obtained film consisting of said temporary support and of said layer of a first polymer;
b) deposition of a layer of a second polymer on said film obtained in step a), wherein said deposition is carried out by the roll-to-roll technique starting from the film of step a) and from an aqueous solution or dispersion of said second polymer, and said second polymer is a conductive polymer, and drying of the so obtained film consisting of said temporary support, a layer of said first polymer, and a layer of said second polymer;
c) detachment of said temporary support from the film coming from step b) by dissolving said layer of a first polymer by immersion in a solvent and consequent release of a mono-layered free-standing film of said second conductive polymer, or by peeling off said layer of a first polymer from said temporary support and consequent release of a bi-layered free-standing film of said first polymer and said second conductive polymer.

Generally, resistance of a extensible and conductive elastic body such as an electroconductive rubber wire or an electroconductive rubber layer is presented by $R = \rho \times L/S$ (in the equation, R is a resistance value ($\Omega$), $\rho$ is a resistivity, L is a length (m) and S is a cross-sectional area ($m^2$)). As shown in the equation, when the electroconductive rubber wire or the electroconductive rubber layer is stretched, the cross-sectional area is getting smaller because it is extended to be longer and thinner. As a result, the resistance value increases.

And when extending thereof, cracks such as micro-cracks or micro-chaps is generated inside the electroconductive rubber wires or the electroconductive rubber layers or on interfacial surfaces between the flexible film and them. As a result, the resistance value increases.

As a substrate for an extensible electronic device, Patent Document 2 discloses an extensible flexible substrate which is provided with an insulating film substance with wires. In the extensible flexible substrate, the insulating film substance has an opened portion which opens by slits, and the opening state of the opened portion is kept by the insulating substance. The elasticity of the insulating film substance cannot be expected so much, because the slits of the insulating film substance are widely opened preliminarily to be deformed three-dimensionally and the opened shape of the slits are kept while sealing the insulating substance. Further, whole insulating film substance, which can be deformed, is sealed by the insulating substance. Therefore, stress occurs more than a little because a mechanical property in the case of extending and deforming thereof is depended upon properties such as elasticity and rubber-elasticity of the insulating substance. Accordingly, it is necessary to apply a considerable force against the rubber-elasticity in order to keep extending thereof.

And Non-patent Document 1 disclose a method for extending and contracting a electroconductive material by a three-dimensional change of its structure having elasticity over 300%, which is a paper cutting craft structure made from a piece of paper treated with a slit cutting process in a shape of alternative linear-cut or bellows-cut. Furthermore, it succeeds a development of an extensible wire which indicates unchanged electroconductivity (i.e. resistance value) against a strain over 200% by processing the paper cutting craft structure of a nanocomposite electroconductive material made of carbon nanotube and paper or parylene layer.

In the method of Non-patent Document 1, it is easy to extend the electroconductive material by drawing because of merely having the slits all over the electroconductive material. However, after that, it is hard to contract the electroconductive material because of no elasticity thereof.

Therefore, an extensible electroconductive wiring material, which is flexible and compact and has general-purpose properties, excellent elasticity and sufficient external-insulation properties towards outside while keeping excellent internal-electroconductivity

PRIOR ART DOCUMENT

Patent Document

[Patent Document 1] WO2016/142850
[Patent Document 2] JP2015-198102A

Non-Patent Document

[Non-patent Document 1] Nature Materials, 14, p. 785-789 (2015)

SUMMARY OF THE INVENTION

Problems to be Solved by the Invention

The present invention was made in view of solving the above described problems. And its object is to provide an extensible electroconductive wiring material, which is flexible; is capable of being reduced in weight, thickness, and size; has high electroconductivity and excellent insulation property against the outside; has sufficient elasticity; and is exceptionally durable without any loss in elasticity after repeated extension and contraction. Also its other object is to provide an extensible conductive wiring module having the extensible conductive wiring material.

Means for Solving Problems

An extensible electroconductive wiring material of the present invention developed to achieve the objects described above comprises: a flexible electroconductive material and insulating elastic bodies,
wherein
the flexible electroconductive material having an electroconductive layer has vent peripheral edge portions in which vent holes and/or vent slits are penetrated and aligned in series and/or in parallel along an energization direction of the electroconductive layer while the vent peripheral edge portions are energizably linked, and the vent peripheral edge portions is sealed and covered by the insulating elastic bodies so as not to be exposed; and
the insulating elastic bodies have penetration slits and/or penetration holes which penetrate therethrough while matching the vent peripheral edge portions and are smaller than the vent holes and the vent slits.

It is preferable that in the extensible electroconductive wiring material, the electroconductive material has vent gaps, which are respectively cut from both of longitudinal sides to central or from one side to the other side of the electroconductive material between the adjacent plurality of the vent peripheral edge portions, and the insulating elastic bodies have gap slits, gap incisions and/or gap holes which are smaller than the vent gap and penetrate therethrough while matching the vent gaps.

It is preferable that the vent holes of the electroconductive material in the extensible electroconductive wiring material have a shape of a square rectangle or a shape of a round rectangle.

It is further preferable that each radius dimension of rounded corners of the vent holes of the electroconductive material is less than half of a length of the vent holes along the energization direction.

In the extensible electroconductive wiring material, for example, a width between an innermost position of an inner edge of the vent gaps and an outermost position of an inner edge of the vent holes relative to a width of a width direction being perpendicular to the energization direction, is ranging from 1:1 to 1:20.

It is preferable that a length along the energization direction of the vent holes of the electroconductive material is at least 0.3 mm.

In the extensible electroconductive wiring material, the electroconductive material has the electroconductive layer on a flexible support body.

In the extensible electroconductive wiring material, both sides of the electroconductive material are sealed and covered by the insulating elastic bodies while covering at least the vent peripheral edge portions.

For example, the electroconductive layer in the extensible electroconductive wiring material is a metallic foil layer, an organic conducting layer and/or a conducting layer including a conductive inorganic substance.

It is further preferable that the electroconductive layer in the extensible electroconductive wiring material is flexible and made from a non-stretchy substance.

For example, in the extensible electroconductive wiring material, the insulating elastic bodies are made from silicone resin, silicone rubber, polyurethane, a thermoplastic elastomer, ethylene-propylene rubber, or fluorine-contained rubber.

For example, in the extensible electroconductive wiring material, the insulating flexible support body is an insulating flexible support body made from polypropylene, polyethylene, polyethylene terephthalate, polycarbonate, polyacetal, polyamide, polyimide, polyether ether ketone, or polyphenylene sulfide.

In the extensible electroconductive wiring material, it is preferable that the vent holes, the penetration holes and/or the vent peripheral edge portions have rounded corners respectively, and/or the vent slits and/or the penetration slits have penetration pinholes at terminals thereof.

In the extensible electroconductive wiring material, it is further preferable that the vent gaps have rounded corners respectively.

The electroconductive material in the extensible electroconductive wiring material may have electric connectors at terminals of the electroconductive layer.

An extensible electroconductive wiring module of the present invention developed to achieve the objects described above comprises a plurality of the extensible electroconductive wiring material accordingly.

It is preferable that the plurality of the extensible electroconductive wiring materials in the extensible electroconductive wiring module is overlapped and integrated.

In the extensible electroconductive wiring module, the plurality of the extensible electroconductive wiring materials may have exposed terminals at respective terminal positions of the electroconductive layers each other, or connects with external terminals at respective terminal positions thereof.

In the extensible electroconductive wiring module, for example, the plurality of the extensible electroconductive wiring materials is a pair or multiple pairs of electrodes.

Effects of the Invention

The extensible electroconductive wiring material of the present invention is extendable, because the flexible electroconductive material having the three-dimensionally-transformable vent holes or vent slits after opening and also having the electroconductive layer is sealed and covered by the insulating elastic bodies having the penetration slits or penetration holes. Therefore, the extensible electroconductive wiring material has peculiar mechanical characteristic properties, which generate little stress at movement of stretch and contraction especially short extension region, and is easy to use at the practical region.

As the electroconductive wiring, the extensible electroconductive wiring material has excellent durability, because the electroconductive material has a plurality of the vent holes or vent slits and therefore the electroconductive layer can follow the deformation thereof by extension due to drawing and by restoration due to subsequent looseness. Furthermore, the extensible electroconductive wiring material does not change a path length of the electroconductive layer in the electroconductive material by the extension of the extensible electroconductive wiring material although the electroconductive material bows outward. And the extensible electroconductive wiring material does not almost change the resistance value with keeping low level because cracks such as microcracks are not generated after the extension and contraction of the extensible electroconductive wiring material. So, it is extremely superior as the wiring material.

And the extensible electroconductive wiring material has the insulating elastic bodies made from silicone resin or silicone rubber which seals the electroconductive material in order to maintain the insulation property. However, the extensible electroconductive wiring material can keep the elasticity as original under the sealing condition after the repeated stretch and contraction. The extensible electroconductive wiring material can prevent to receive noises during detecting signals in a solution or of a living body, because the electroconductive material is sealed and covered without exposure except for terminals when contacting to an external device or an object to be measured at the terminals.

The extensible electroconductive wiring material indicates excellent restoration property for its structure after the stretch and contraction and can be restored to the original shape before the extension, because the flexible electroconductive material has the electroconductive layer on the flexible support body and is sealed by the insulating elastic bodies. Therefore, the extensible electroconductive wiring material has high durability, because it suppresses permanent deformation set after the stretch and contraction due to elastic properties and shape characteristics of the insulating elastic bodies.

The prior electroconductive material accompanies elasticity by the stretch and contraction of its own material. Compared with it, the extensible electroconductive wiring material accompanies a three-dimensional structure change by the vent holes or the vent slits as different features from prior electroconductive material. And the insulating elastic bodies having the shape which do not inhibit the electroconductivity or the flexibility, can seal the electroconductive material. Accordingly, the extensible electroconductive wiring material can improve a coefficient of extension because of not only the mechanical characteristic properties of the deformed insulating elastic bodies but also a deforming property of three-dimensional structure.

The extensible electroconductive wiring module may be produced by using the extensible electroconductive wiring material. The extensible electroconductive wiring module is flexible, is capable of being reduced in weight, thickness, and size; has high electroconductivity and excellent insulation property against the outside; has sufficient elasticity; and is exceptionally durable without any loss in elasticity after repeated extension and contraction.

The extensible electroconductive wiring material generated little stress, because the deformation of the extensible electroconductive wiring material is generated by change of three-dimensional structure in a short extension region specially. Therefore, the extensible electroconductive wiring module can be installed into flexible devices such as wearable devices and flexible substrate etc. The extensible electroconductive wiring module does not make its wearer discomfort when using it as the wearable device, because it achieves little stress under the short extension region.

BRIEF DESCRIPTION OF DRAWINGS

FIG. 5 is a schematic perspective view which indicates a separation state of the extensible electroconductive wiring module of the other embodiments of the present invention.

FIG. 6 is a figure of graphs which indicates correlative relationship between an extension ratio, and changes of resistance and stress of the extensible electroconductive wiring material of the present invention.

FIG. 8 is a figure of photographs which indicates states before and after extension and contraction of the extensible electroconductive wiring material which applies the present invention and the extensible electroconductive wiring material which does not apply the present invention.

FIG. 14 is a figure of photographs which indicate a state before stretch, a state while stretch and a restoration state after stretch of the extensible electroconductive wiring material that applies the present invention and an extensible electroconductive wiring material that does not apply the present invention and have no insulating elastic bodies.

MODE FOR CARRYING OUT THE INVENTION

Figure 1:
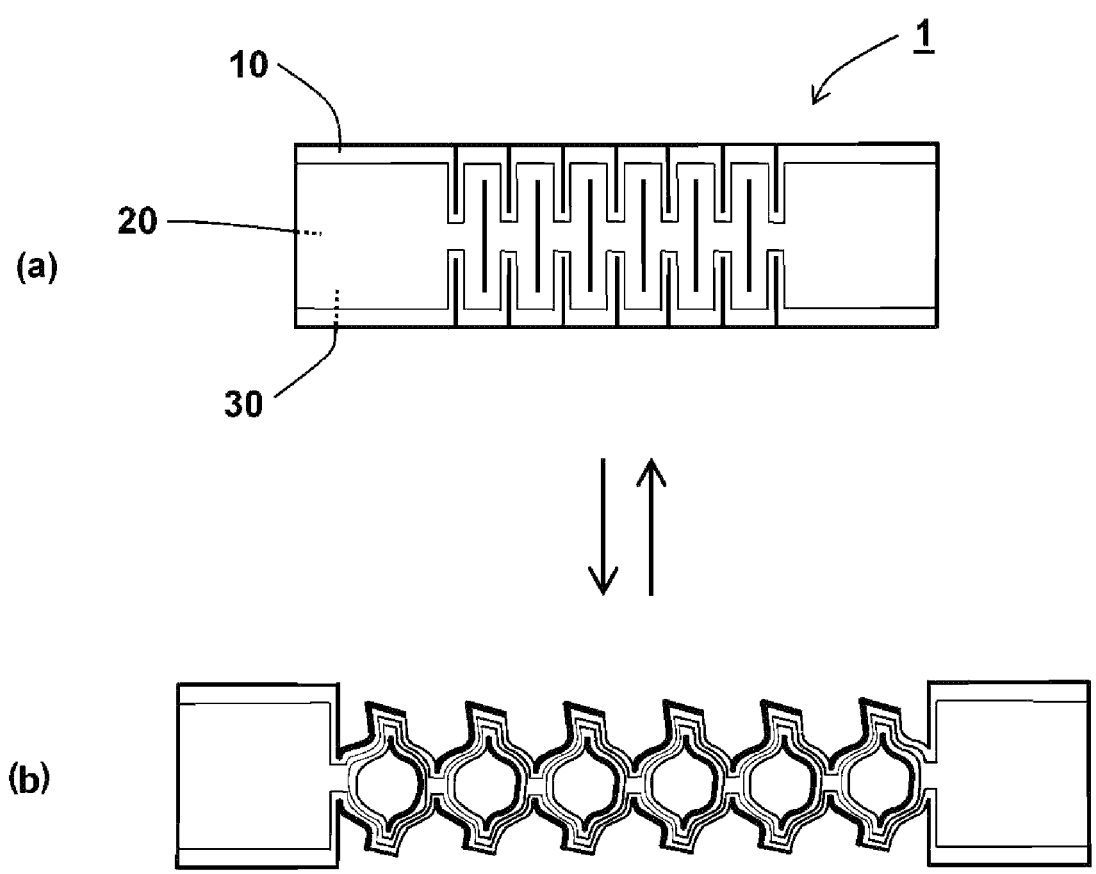
FIG. 1 is a plan view which indicates a usage state of the extensible electroconductive wiring material of the present invention.

Hereunder, embodiments to practice the present invention in detail will be explained, but the scope of the present invention is not restricted by these embodiments.

A preferable embodiment of the extensible electroconductive wiring material 1 of the present invention will be explained while referring to FIG. 1 and FIG. 2. The extensible electroconductive wiring material 1 has a flexible and flat electroconductive material 20 which includes an electroconductive layer 20A and a flexible support body 20B, and has a flat insulating elastic bodies 10, 30 which sandwich them.

The flexible support body 20B made from an insulating resin and the electroconductive layer 20A as a metal layer which is put thereon have the same shape in the electroconductive material 20. The electroconductive material 20 has a shape of a long sheet along an energization direction of the electroconductive layer 20A.

In the electroconductive material 20, a plurality of vent holes 23 having a shape of rectangle is penetrated and arranged in a raw along a longitudinal direction. At first, the vent holes 23 are not stretched toward a longitudinal direction, and penetrated and arranged so that the narrow sides of the shape of rectangle thereof are paralleled to the longitudinal direction and the long sides thereof are crossed at right angles of the longitudinal direction. Circumference portions of the vent holes 23 are respectively plural vent peripheral edge portions 24 which configure a part of the electroconductive layer 20A and the flexible support body 20B respectively. Thereby, the widths of the circumference portions of the vent peripheral edge portions 24 along the longitudinal direction and along its right angle direction are equal to the widths of ones of the electroconductive material 20 along the longitudinal direction and along its right angle direction. The electroconductive material 20 has vent gaps 22 between plural adjacent vent peripheral edge portions 24 respectively. The vent gaps 22 are cut from both long sides of the electroconductive material to the center thereof. Each of the adjacent vent peripheral edge portions 24 respectively have bridge portions 25 which are arranged along the longitudinal direction of the electroconductive material 20 on the center thereof. The bridge portions 25 can be energized in the electroconductive layer 20A, because the bridge portions 25 configure a part of the electroconductive layer 20A and the flexible support body 20B as well as the vent peripheral edge portions 24.

The insulating elastic bodies 10, 30 have same length with the electroconductive material 20 along the longitudinal direction, and they have margins so as to envelop the electroconductive material 20 because the width of the right angles of the longitudinal direction thereof is larger than one of the electroconductive material 20. The vent peripheral edge portions 24 are sealed and covered by the insulating elastic bodies 10, 30 so that the bridge portions 25 are not exposed outside.

In both of the insulating elastic bodies 10, 30, penetration slits 13, 30 which are smaller than the vent holes 23 are penetrated so as to be aligned with the positions of the vent holes 23 in the vent peripheral edge portions 24. Because the penetration slits 13, 33 are smaller than the vent holes 23, the insulating elastic bodies 10, 30 can seal, adhere and cover to envelop the vent peripheral edge portions 24 by the margin where the peripheries of the penetration slits 13, 33 are adhered each other. Thereby, the vent peripheral edge portions 24 cannot be exposed outside.

And gap slits 12, 32, which are smaller than the vent gaps 22, are respectively penetrated so as to be aligned with the positions of the vent gaps 22 between the vent peripheral edge portions 24 in both of the insulating elastic bodies 10, 30. The gap slits 12, 32 are cut in the insulating elastic bodies 10, 30 from both sides thereof along the right angles of the longitudinal direction to the center thereof so as not to reach the bridge portions 25. Because the penetration slits 12, 32 are smaller than the vent gaps 22, the insulating elastic bodies 10, 30 can seal, adhere and cover to envelop the vent peripheral edge portions 24 by the margin where the peripheries of the gap slits 12, 32 are adhered each other. Thereby, the vent peripheral edge portions 24 and the bridge portions 25 cannot be exposed outside.

In the extensible electroconductive wiring material 1, the gap slits 12 and the penetration slits 13 of the insulating elastic body 10, and the gap slits 32 and the penetration slits 33 of the insulating elastic body 30 are overlapped and adhered by the margin through the vent gaps 22 between the vent peripheral edge portions 24 and the vent holes 23 in the vent peripheral edge portions 24. Accordingly, the vent peripheral edge portions 24 can be opened or closed from the shape of the rectangle to a shape of rhomb, and the vent gaps 22 can be seceded. Thereby, the extensible electroconductive wiring material 1 can be stretched and contracted.

A front side and a back side of the extensible electroconductive wiring material 1 are covered by the insulating elastic bodies, thereby, also edge faces along the longitudinal direction of the extensible electroconductive wiring material 1 are completely covered so as not to be exposed. However, end portions 21, 26 of both terminals of the longitudinal direction are exposed to be able to connected to the external devices if necessary.

The extensible electroconductive wiring material 1 operates as follows.

First of all, the extensible electroconductive wiring material 1 is almost flat according to the flat electroconductive material 20 and the flat insulating elastic bodies 10, 30. When the extensible electroconductive wiring material 1 is drawn along the longitudinal direction by comparatively week tensile stress so as to pull ahead of the end portions 11, 21, 31 and the end portions 16, 26, 36, the vent peripheral edge portions 24 are opened to be banked a little with a twist pretty as shown from (a) to (b) of FIG. 1. In this time, although the short sides of the vent peripheral edge portions 24 are merely twisted somewhat with little extension against the tensile stress, the long sides of the vent peripheral edge portions 24 are bended or curved to be twisted much beyond the tensile stress. And the gap slits 12, 32 are opened according to them. At that moment, although the gap slits 12, 32 are cut from both sides, they are not reached to the bridge portions 25. Therefore, neighborhoods of the bridge portions 25 are opened and bended with little twist. Accordingly, the electroconductive material 20 and the insulating elastic bodies 10, 30 adhered thereto are similarly twisted and stretched, and the extensible electroconductive wiring material 1 extends. At that time, inside portions of the vent peripheral edge portion 24 are opened toward the longitudinal direction. The vent holes 23 deform from the shape of the rectangle to the shape of approximately twisted rhomb or approximately twisted polygon whose corners are formed by the bridge portions 25 and the inner short side in the vent peripheral edge portions 24. They contribute the extension. On the other hand, since the bridge portions 25 are not able to be stretched and twisted, they do not contribute the extension, rather prevent excess deformation or faulty deformation of the vent peripheral edge portions 24.

As the results, the extensible electroconductive wiring material 1 can extend telescopically, unless extensible electroconductive wiring material 1 is strongly drawn so as to dilacerate the vent peripheral edge portions 24.

After that, when the extensible electroconductive wiring material 1 is stopped to be drawn and the tensile stress is relieved, the vent peripheral edge portions 24 and the gap slits 12, 32 are closed with decreasing the bank while resolving the twist, as shown in FIG. 1 (a). And it backs to the original shapes thereof according the elastic force of the insulating elastic bodies 10, 30. At that time, although the short side portions of the vent peripheral edge portion 24 are neither stretched nor contracted, the twist thereof is relieved. The tensile stress is relieved at the long side portions of the vent peripheral edge portion 24. Also the tensile stress is relieved at the gap slits 12, 32. According to it, the vent peripheral edge portions 24 are deformed again so that the curve or the bend thereof backs to the original shapes. Accordingly, while the twist and the bank of the electroconductive material 20 and the insulating elastic bodies 10, 30 are relieved, the extensible electroconductive wiring material 1 is contracted to become the original shape thereof. At that time, the inside portions of the vent peripheral edge portion 24 and the gap slits 12, 32 are closed along the longitudinal direction and contribute the contraction. On the other hand, since the bridge portions 25 do not contract and does not contribute the extension and contraction, and they rather help restoration to the original shape of the vent peripheral edge portions 24. Thus, the extensible electroconductive wiring material 1 restores to the original shape from the stretched shape.

When the extensible electroconductive wiring material 1 is stretched and contracted, the shape of the electroconductive material 20 is merely deformed by a plurality of the lined vent holes 23. Since the insulating elastic bodies 10, 30 are sealed, the extensible electroconductive wiring material 1 has little stress for the movement of stretch and contraction. Especially, the stress does not generate almost on the short stretch portions. And after the extensible electroconductive wiring material 1 repeats the movement of stretch and contraction, it does not cause permanent deformation or damages by change of the shape of the electroconductive material 20 and has excellent durability and endurance. It keeps a low resistance value of the electroconductive material 20 and do not cause the change thereof, and has excellent electroconductive property besides.

Since the electroconductive material 20 is tightly sealed by the insulating elastic bodies except for the edges of the end portions 26 which may act as terminals, the extensible electroconductive wiring material 1 does not cause leaks or discharge unwillingly and has excellent electronic properties.

Figure 2:
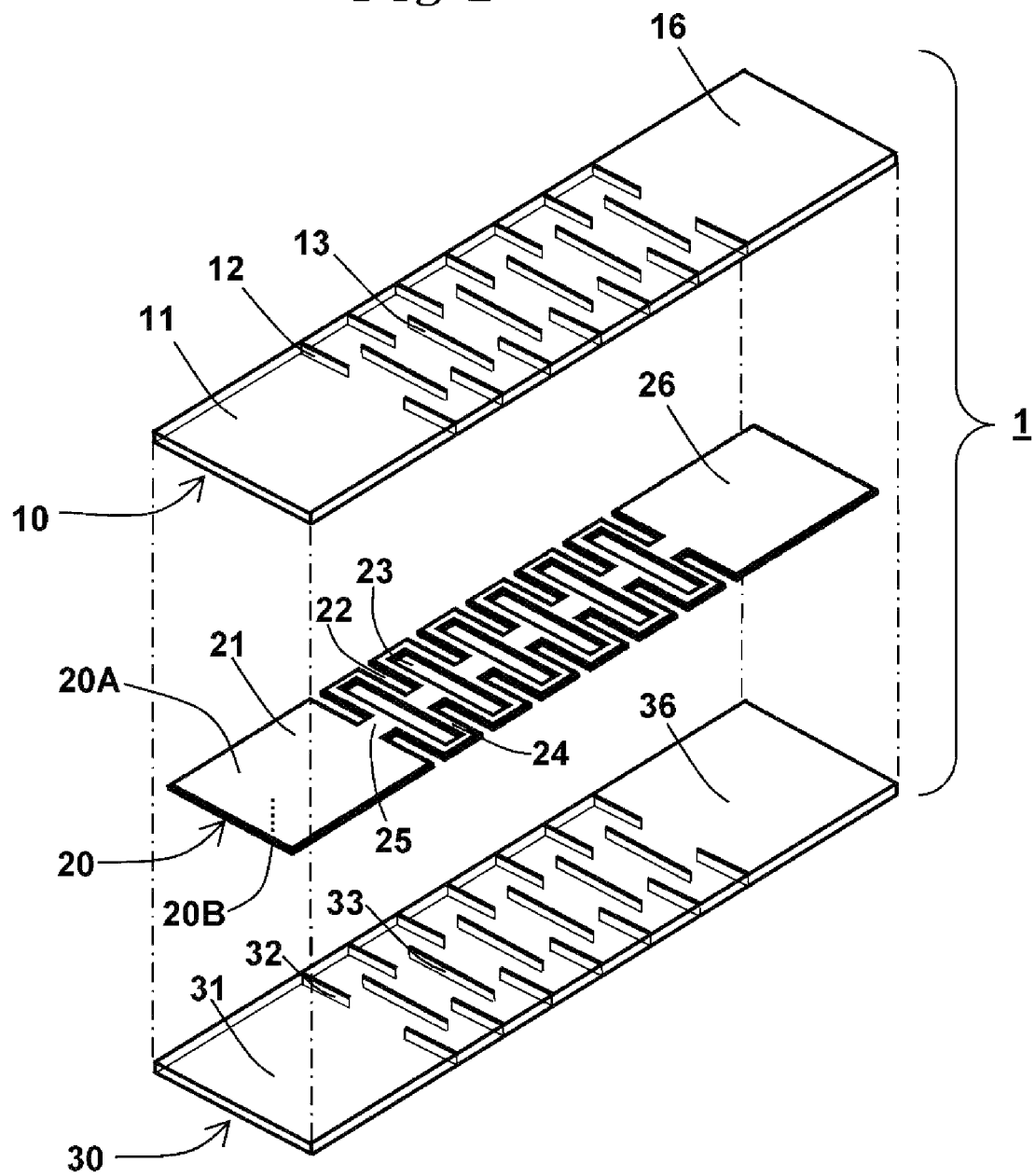
FIG. 2 is a schematic perspective view which indicates a separation state of the extensible electroconductive wiring material of the present invention.

Incidentally, although the extensible electroconductive wiring material 1 is explained as the shape indicated in FIGS. 1 and 2, the shapes of structure of respective features may have any shapes.

The extensible electroconductive wiring material 1 may not be flat at an initial state. It may be a shape of a curve, curvature or screw.

The shape of the vent peripheral edge portion 24 of the electroconductive material 20 in the extensible electroconductive wiring material 1 may be a shape of polygon such as a square, an approximate quadrangle with flat cut corners, a rhomboid, a hexagon and an isosceles trapezoid, a shape of an ellipse, a shape of a warpage rhomboid, or a shape of a rectangle with round corners, or combination thereof. It may be a shape of zigzag with the bridge portions 25.

In the extensible electroconductive wiring material 1, the vent holes 23 of the electroconductive material 20 may be wider and longish holes, and the penetration slits 13, 33 of the insulating elastic bodies 10, 30 may be slimmer and shortish holes or slits. The vent holes 23 of the electroconductive material 20 may be wider and longish slits, and the penetration slits 13, 33 of the insulating elastic bodies 10, 30 may be slimmer and shortish slits.

The electroconductive material 20 in the extensible electroconductive wiring material 1 may be an electroconductive layer 20A as a metal layer which is partially applied on a flexible support body 20B made from an insulating resin.

The extensible electroconductive wiring material 1 may be symmetrical or asymmetrical.

The extensible electroconductive wiring material 1 may not have the vent gaps 22 or the gap slits 32.

It is preferable that the electroconductive layer 20A in the extensible electroconductive wiring material 1 is suitably selected so that the resistance value of the extensible electroconductive wiring material 1 with no covered insulating elastic bodies 10, 30 is preferably of 1 kΩ at a maximum, more preferably 0.2 kΩ at a maximum. The extensible electroconductive wiring material 1 having the resistance value can be adjusted by using the electroconductive layer 20A which is homogenous and has little cracks.

A flexible electroconductive raw material can be used for the electroconductive layer 20A of the electroconductive material 20 in the extensible electroconductive wiring material 1. And it is appropriately selected from a metal film layer made or metal such as copper, silver and gold or alloy, an electroconductive film layer including an electroconductive inorganic compound, and an organic electroconductive film layer made of an organic electroconductive raw material or an organic electroconductive ink. Among them, it is preferable that the electroconductive layer 20A is made from copper, silver or gold which have low resistance and high ductibility. The thickness of the electroconductive layer 20A may be appropriately adjusted from 1 nm to 1 mm. When it is below this range, the electroconductive layer 20A is hard to be homogenously formed as a layer shape and deteriorates electroconductivity. On the other hand, when it is over this range, the electroconductive layer 20A is excessively thick and hard to keep the flexibility. The lower limit is more preferably 10 nm, and further more preferably 100 nm. The upper limit is more preferably 0.5 mm, and further more preferably 0.1 mm.

The electroconductive layer 20A in the electroconductive material 20 is applied on the flexible support body 20B by printing, etching, sputtering or pasting etc.

When an extensible electroconductive wiring material 1 consists of merely the electroconductive layer 20A without the insulating elastic bodies 10, 30 or with a flexible support body 20B thereon, it cannot restore to an original shape due to plastic deformation. In comparison with it, the extensible electroconductive wiring material 1, in which the electroconductive layer 20A is provided on the insulating elastic bodies 10, 30, has excellent elasticity restoration of the extensible electroconductive wiring material 1 with the electroconductive material 20 much because it restores the shape by the elasticity of the insulating elastic bodies 10, 30 without plastic deformation.

The flexible support body 20B of the electroconductive material 20 in the extensible electroconductive wiring material 1 is not restricted as long as insulating materials having flexibility and elasticity, and may be preferably made from a plastics which is arbitrarily selected from a general purpose plastics such as polypropylene, polystyrene, polyethylene terephthalate, an engineering plastics such as polycarbonate, polyacetal, polyamide, a super engineering plastics such as polyimide, polyether ether ketone, polyphenylene sulfide, etc, even if it is made from a flexible and elastic insulating material. Among them, it is preferable that the electroconductive material 20 is made from polyimide, polyethylene terephthalate, polycarbonate, polyphenylene sulfide. The thickness of the flexible support body 20B can be freely set as a range from 1 µm to 1 mm. If it is below this range, the flexible support body 20B is difficult to maintain the insulation and support properties. If it is over this range, the flexible support body 20B is difficult to maintain flexibility. The lower limit is more preferably 10 µm, and further more preferably 50 µm. The upper limit is more preferably 0.5 mm, and further more preferably 0.2 mm.

If the extensible electroconductive wiring material 1 has no flexible support body 20B, it is difficult to stretch and contract sufficiently by only insulating elastic bodies 10, 30.

The insulating elastic bodies 10, 30 in the extensible electroconductive wiring material may be preferably made from a plastics which is arbitrarily selected from a silicone resin or silicone rubber such as polydimethylsiloxane, polydiphenylpolysiloxane, polyfluorosiloxane, a polyurethane such as soft polyurethane, hard polyurethane, a plastic elastomer such as polystyrene, an ethylene propylene rubber such as ethylene-propylene-diene rubber, a fluororubber such as vinylidene fluoride, tetrafluoroethylene-propylene, tetrafluoroethylene-perfluorovinylether, etc., even if it is made from a flexible insulating material which can cover them. Among them, it is preferable that the insulating elastic bodies 10, 30 are made from the silicone resin or silicone rubber which has excellent insulation and workability properties. The thickness of the insulating elastic bodies 10, 30 can be arbitrarily set as a range from 10 µm to 10 mm. If it is below this range, the insulating elastic bodies 10, 30 are difficult to maintain the durability and insulation properties. If it is over this range, the insulating elastic bodies 10, 30 are difficult to maintain flexibility or difficult to extend unless drawing it forcibly and make the elasticity decrease. The lower limit is more preferably 10 µm, and further more preferably 20 µm. The upper limit is preferably 5 mm, more preferably 1 mm, and further more preferably 200 µm.

The hardness of the insulating elastic bodies 10, 30 of the extensible electroconductive wiring material 1 can be chosen from 10 to 90 of Shore A hardness. Among them, it is preferable that Shore A hardness thereof is 10 to 50, because of excellent strength or extension properties.

The vent peripheral edge portions 24 of the electroconductive material 20 in the extensible electroconductive wiring material 1, in which the vent holes 23 or vent slits are punctured, may be spaced by the vent gaps 22 and arranged in a row along the longitudinal direction in series while being connected by the bridge portions 25 each other. A plurality of lines thereof may be arranged in parallel. The penetration slits 13, 33 which are smaller than the vent holes 23 or vent slits, and the gap slits 12, 32 which are smaller than the vent gaps 22 may be respectively punctured in the insulating elastic bodies 10, 30 with positioning with the vent holes 23 and the vent gaps 22.

Figure 3:
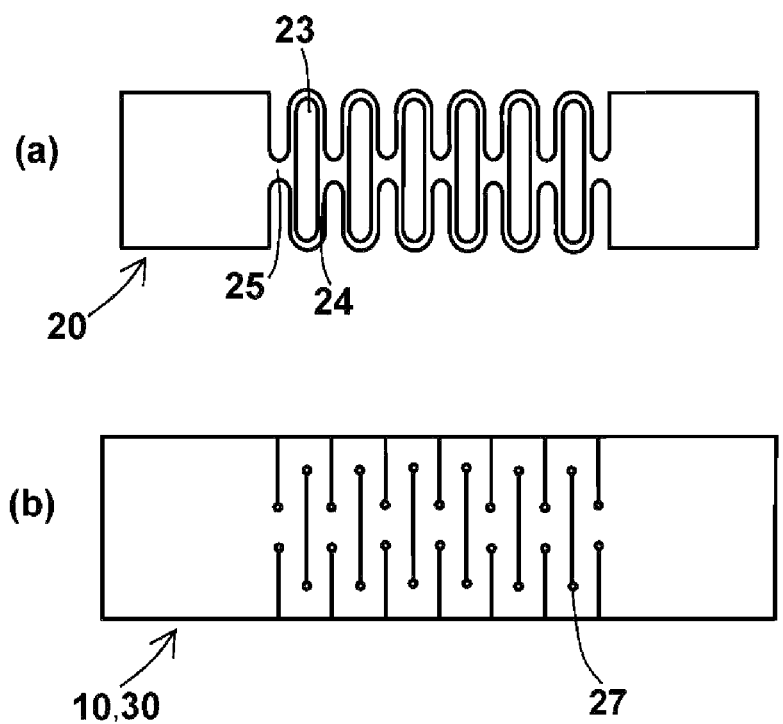
FIG. 3 is a plan view which indicates the electroconductive material and the insulating elastic bodies in the extensible electroconductive wiring material of the other embodiment of the present invention, respectively.

As shown in FIGS. 3 (a-1) and (a-2), inner corners 23a of the vent holes 23 of the electroconductive material 20 and/or the penetration holes of the insulating elastic bodies 10, 30 in the extensible electroconductive wiring material 1 may be rounded respectively. Inner or outer corners 24a of the vent peripheral edge portions 24 may be rounded respectively. Connected corners 25a between the vent peripheral edge portions 24 and the bridge portions 25 may be rounded.

Although each of the vent holes 23 or the inner corners may not be rounded, it is preferable that they are rounded. When the inner corners of each of the vent holes 23 are not rounded, the vent holes 23 tend to be easily dilacerated because the tensile stresses are concentrated at the corners on the inner angle thereof when stretching the extensible electroconductive wiring material 1 (see FIG. 1 (a)). On the other hand, if the radius dimension of the rounded inner corners of each vent holes 23 is just half of length of the vent holes along the energization direction (i.e. full R), the vent holes 23 tend to be easily dilacerated because intervals between those corners 23a become circular arcs as semicircle and thereby the tensile stresses are concentrated at the center of the semicircle (see FIG. 3 (a-1)). In contrast, when the radius dimension of the rounded inner corners of each vent holes 23 in the electroconductive material 20 is less than half length of the vent holes along the energization direction (see FIG. 3(a-2)), the vent holes 23 tend to be difficulty dilacerated more than vent holes having no rounded corners or having the full R because tensile stresses applied on the vent holes 23 can be dispersed by generating liner portions 23b as non-circular arcs connected to the corners having the arc shape toward inner edges of the vent holes along the energization direction when stretching the extensible electroconductive wiring material 1.

The corners of outer circumference of the vent peripheral edge portions 24, which surround the vent holes 23 in order to form them, may be rounded as well as the inner circumference of the vent peripheral edge portions 24 to form the vent holes 23. It is preferable that the radius dimension of the outer circumference thereof is less than half of each length of the vent peripheral edge portion 24 along the energization direction.

And the corners of the bridge portions 25 in the vent gaps 22 to form the bridge portions 25 may be rounded. It is preferable that the radius dimension of the corners thereof is less than half of the length of the vent gaps 22 along the energization direction (see FIG. 3 (a-2)).

Figure 12:
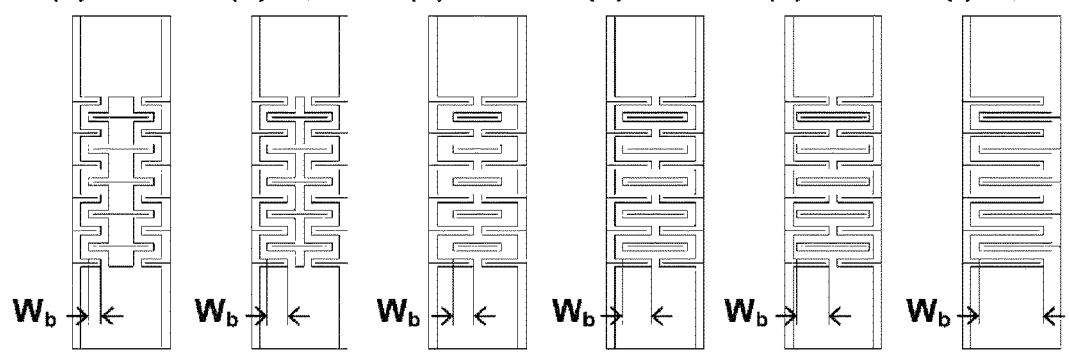
FIG. 12 is a figure which indicates embodiments side by side in the extensible electroconductive wiring material of the present invention having different shapes of the width between the innermost position of the inner edge of the vent gap and outermost position of the inner edge of the vent hole.

Although the embodiment, in which the vent gaps 22 of the electroconductive material 20 are faced to be cut from both longish sides to center thereof between the plurality of the vent peripheral edge portions each other, they may be faced to be cut from one side thereof to the other side (see FIG. 12 (f)).

The width $W_b$ between innermost position of the inner edge of vent gap 22 and outermost position of the inner edge of vent hole 23 based on width $W_a$ along a width direction as a right angle of the energization direction is ranging from 1:0.1 to 1:0.9, preferably from 1:0.15 to 1:0.8.

When the vent holes have shapes of a rectangle having no rounded corners or rounded corners with the length ranging at least 0.3 mm along the energization direction, the electroconductive material 20 can maintain the higher coefficient of extension when stretching until rupture or the higher coefficient of extension when changing 10% of the resistance values than ones having the vent slits.

As shown in FIG. 3(b), the vent slits of the electroconductive material 20, the penetration slits 13, 33 and the gap slits 12, 32 of the insulating elastic bodies 10, 30 in the extensible electroconductive wiring material 1 may have penetration pinholes 27 at the terminals thereof.

The electroconductive material 20 and the insulating elastic bodies 10, 30 in the extensible electroconductive wiring material 1 may be adhered through an adhesive, may be heat-sealed, may be bonded through chemical bonds, or may be formed integrally.

The extensible electroconductive wiring material 1 may have electric connectors 28, for example, ring snap terminals or cable cramp terminals for connection to the external devices at one end portion 21 of the electroconductive layer 20A which is sealed by end portions 11, 31 of the insulating elastic bodies 10, 30.

In the extensible electroconductive wiring material 1, the other end portion 26 of the electroconductive layer 20A may be a terminal by exposure thereof from at least one of terminal 16, 36 of the insulating elastic bodies 10, 30. The other end portion 26 may be divided as fork.

The extensible electroconductive wiring material 1 consist of a minimum unit of 3 layers by sealing and covering the electroconductive material 20 with the vent peripheral edge portions 24 and the bridge portions 25 of the electroconductive material 20 so as not to expose them between the insulating elastic bodies 10, 30.

The extensible electroconductive wiring material 1 may be used for one electrode of a pair of electrodes for detecting biological signals.

The whole end portions 21, 26 of respective end portion side along the longitudinal direction in the electroconductive material 20 of the extensible electroconductive wiring material 1 may be completely covered so as not to be exposed by the end portion 11, 31 and 16, 36 of respective end portion side along the longitudinal direction of the insulating elastic bodies 10, 30. The electroconductive layer 20A is connected to the electric connector 28 in order to connect to the external devices at the end portions 21, 26.

As shown in FIG. 4(b), in the electroconductive material 20 of the extensible electroconductive wiring material 1, the whole end portion 21 of one end portion side along the longitudinal direction may be completely sealed and covered by the insulating elastic bodies 10, 30 in order to connect to the electric connector 28, and the other end portion 26 may be partially exposed in order to be able to connect electrically through a cramp (not shown).

The end portions 21, 26 of the electroconductive material 20 may be partially exposed, as shown in FIG. 4(c). The end portions 21, 26 along the longitudinal direction is partially covered by the end portions 11, 31 and 11, 36 of the insulating elastic bodies 10, 30 along the longitudinal direction, and the electroconductive material 20 is covered while a part of end portion side of the end portions 21, 26 is exposed to the external. The end portions 21, 26 are exposed in order to connect directly to the object to be measured.

Figure 4:
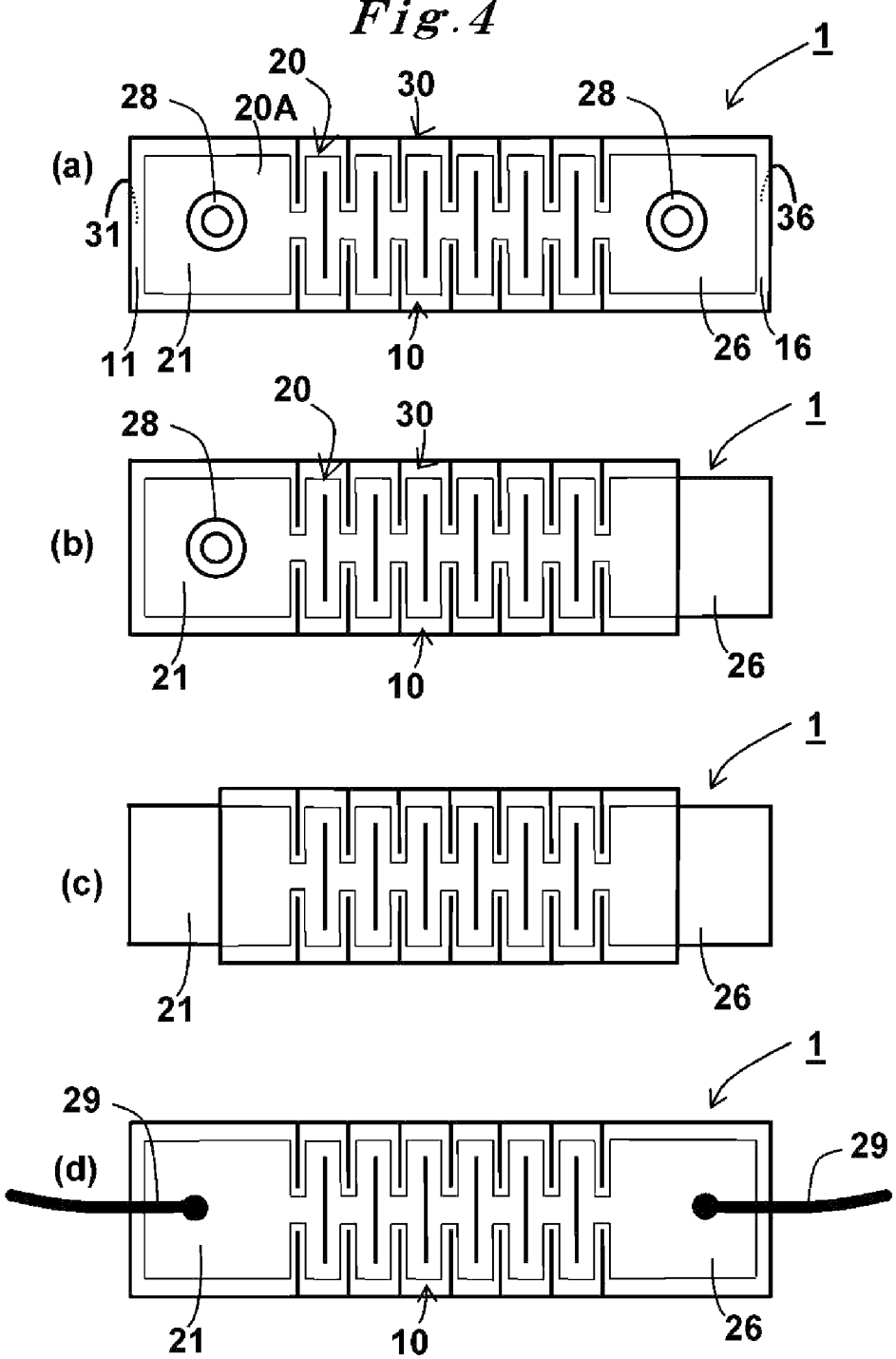
FIG. 4 is a plan view which indicates the extensible electroconductive wiring material of the other embodiments of the present invention.

The electroconductive material 20 may be completely sealed and covered by the insulating elastic body 10, while the end portions 21, 26 are partially exposed and soft-soldered to a connection code 29 as shown in FIG. 4 (d).

As shown in FIG. 5(a), a plurality of the extensible electroconductive wiring materials 1 are overlapped and integrated to become an extensible electroconductive wiring module 40. As shown in FIG. 5(b), the insulating elastic body 30 as the lower layer under the upper extensible electroconductive wiring material and the insulating elastic body 10 as upper layer above the lower extensible electroconductive wiring material are doubled, when the plurality of the extensible electroconductive wiring materials 1 is overlapped. By the structure thereof, the extensible electroconductive wiring materials 1 may be a pair of the electrodes as two electroconductive substrates by a structure of 5 layers consisting of the insulating elastic body, the electroconductive material, the insulating elastic body, electroconductive material and the insulating elastic body, or may be two pairs of the electrodes as four electroconductive substrates by a structure of 9 layers consisting of the insulating elastic body, the electroconductive material in this order.

A plurality of the extensible electroconductive wiring materials 1 of the extensible electroconductive wiring module 40 may contact to the external terminals respectively through each end portions 21 of the each electroconductive layer 20A. Alternatively, a plurality of the extensible electroconductive wiring materials 1 of the extensible electroconductive wiring module 40 may act respectively the exposed terminals at the other end portions 26 of the each electroconductive layers 20A.

When the sealed portions of the extensible electroconductive wiring material(s) 1 or extensible electroconductive wiring module 40 are immersed into an electrolyte solution, the electrolytic solution does not transude and ooze to the electroconductive material 20.

Thus the extensible electroconductive wiring material 1 and the extensible electroconductive wiring module 40 can detect signals ranging from 1 Hz to 100 kHz. Since the biological signals include several Hz to several kHz, especially around 100 Hz of myogenic potential signals, they can be detected by the extensible electroconductive wiring material 1 or extensible electroconductive wiring module 40 sufficiently.

The extensible electroconductive wiring material 1 or the extensible electroconductive wiring module 40 are manufactured as follows.

First of all, the electroconductive material 20 is prepared as follows. A copper layer is applied onto a polyimide film by sputtering to prepare a Cu-sputtered polyimide film. And then, it is punched as shown in FIG. 1 to form the vent holes 23, the vent gaps 22 therebetween, the vent peripheral edge portions 24 naturally configured thereby, and the bridge portions 25 connected with the vent holes 23 at the midpoint of the longish electroconductive material 20. Accordingly the electroconductive material 20 is obtained.

Next, the insulating elastic bodies 10, 30 are prepared as follows. While a silicone rubber sheet is cut out so as to be larger than outline of the electroconductive material 20 by a margin, the penetration slits 13, 33 which were smaller than the vent holes 23 and are positioned with the vent holes 23 in the vent peripheral edge portions 24 and the gap slits 12, 32 which are smaller than the vent gaps 22 and are positioned with the vent gaps 22 between the vent peripheral edge portion 24 are cut into it to prepare the insulating elastic bodies 10, 30.

Finally, while the vent holes 23 are positioned with the penetration slits 13, 33 and the vent gaps 22 are positioned with the gap slits 12, 32, the electroconductive material 20 and the insulating elastic bodies 10, 30 are overlapped and joined through an adhesive so as to enfold the vent peripheral edge portions 24 by the margin and to seal, adhere and cover them. Accordingly the extensible electroconductive wiring material 1 is obtained.

Incidentally, the electroconductive material 20 may be prepared by etching a flexible support body having a copper layer, instead of using the Cu-sputtered polyimide film. An electroconductive film layer including an electroconductive inorganic compound such as an electroconductive ink layer film, which is prepared by applying an electroconductive ink including carbon paste on a flexible support body having the formed vent holes 23, vent gaps 22 and bridge portions 25, may be formed. An electroconductive organic layer film, which is prepared by applying an electroconductive organic ink, may be formed.

The embodiment, in which the electroconductive material 20 and the insulating elastic bodies 10, 30 are joined by the adhesive. Alternatively the extensible electroconductive wiring material 1 may be obtained by another manufacturing method as follows. Silicone rubber sheet pieces of the insulating elastic bodies 10, 30, which are larger than the electroconductive material 20 by the margin, are pasted on the electroconductive material 20 having the formed vent holes 23, vent gaps 22 and bridge portions 25. Then, the penetration slits 13, 33 which are smaller than the vent holes 23 are cut in while matching the position with the vent holes 23 in the vent peripheral edge portions 24, and the gap slits 12, 32 which are smaller than the vent gaps 22 are cut in while matching the position with the vent gaps 22 between the vent peripheral edge portions 24. Accordingly the extensible electroconductive wiring material is obtained.

The extensible electroconductive wiring material 1 may be obtained by the other manufacturing method as follows. A silicon rubber sheet piece to be the insulating elastic body 10 or 30 is pasted with an adhesive on any one side of the electroconductive material 20 having the formed vent holes 23, vent gaps 22 and bridge portions 25. Then, a silicone rubber curable resin component composition is applied, sprayed or immersed on the other side of the electroconductive material 20 and the other insulating elastic body 30 or 10 is formed. After that, the penetration slits 13, 33 are cut in while matching the position with the vent holes 23 in the vent peripheral edge portions 24, and the gap slits 12, 32 are cut in while matching the position with the vent gaps 22 between the vent peripheral edge portions 24, as well as above-mentioned method. Accordingly the extensible electroconductive wiring material is obtained.

The extensible electroconductive wiring material 1 may be obtained by the further different manufacturing method as follows. A silicone rubber curable resin component composition is applied, sprayed or immersed on both sides of the electroconductive material 20 having the formed vent holes 23, vent gaps 22 and bridge portions 25 to prepare the insulating elastic bodies 10, 30 with a single swoop. After that, the penetration slits 13, 33 are cut in while matching the position with the vent holes 23 in the vent peripheral edge portions 24, and the gap slits 12, 32 are cut in while matching the position with the vent gaps 22 between the vent peripheral edge portions 24, as well as above-mentioned method. Accordingly the extensible electroconductive wiring material is obtained.

The formations of the piled structure of the extensible electroconductive wiring material 1 are repeated to prepare the extensible electroconductive wiring module 40, if necessary. The electric connector is set up on one end portion 21 of the electroconductive layer 20A in the extensible electroconductive wiring module 40, if necessary. The electric connector may be soldered to be set up, or may be set up by thrusting a ring snap terminal.

The extensible electroconductive wiring module 40, in which the extensible electroconductive wiring materials 1 are piled up multiply and/or are distributed in series and/or in parallel, is used as a wearable device which can be detachable, disposable and sanitary. The extensible electroconductive wiring module 40 can be widely used for a myoelectricity measurement of a small muscle such as a facial muscle and a palm muscle or a large muscle. A pair of the extensible electroconductive wiring modules 40 can be used as a set of both electrodes. 1-4 sets thereof consisting of 2-8 electrodes may be used for the myoelectricity measurement at various positions or the three-dimensional myoelectricity measurement of the muscles of a living body.

The extensible electroconductive wiring modules 40 may be used for checking a recovery state in the rehabilitation by measurement of the myoelectricity, checking a condition of diseases such as a mucclua disease called myopathy, or searching a physical fitness of an athlete. And it may be used for measuring myoelectricity exactly while following the movement of the muscle in order to record the working movement of the artisan as the change of the myoelectricity for recording a craftsmanship as technical data to posterity.

The extensible electroconductive wiring modules 40 not only can detect a desired potential without detecting a unnecessary noise while keeping the insulating property because the exposed terminals are distributed at only necessary positions and the other positions are sealed except for it, but also can maintain the electrromotion property when repeating the movement of stretch and contraction.

EMBODIMENTS

Examples of an extensible electroconductive wiring material of the present invention and Comparative examples of an extensible electroconductive wiring material outside present invention were carried out so as to produce them. Example thereof was carried out so as to produce them through the steps of: sputtering copper to a polyimide film to obtain an electroconductive raw material; processing the electroconductive raw material so as to have a shape of multiple opening structures; insulation-sealing the electroconductive raw material by silicone rubbers processed via slitting; and adhering these. Results of having compared characteristics of Examples and Comparative examples will be described in below.

Example 1

Kapton film 100H was employed as a flexible support body 20B. Copper-sputtering was performed by a RF sputter apparatus (SPT-4STD, manufactured by Toei Scientific Industrial Co., Ltd.) for 3 minutes. An electroconductive layer 20A having 0.15 $\Omega/cm^2$ of a resistance value and 300 nm of thickness was formed. Thereby, an electroconductive material 20 was obtained. As insulating elastic bodies 10, 30, silicone rubber sheets having 0.2 mm of thickness were employed. The electroconductive material 20 and the insulating elastic bodies 10, 30 were respectively processed so as to have shapes shown in FIGS. 1 and 2, and then a silicone based adhesive (tradename SUPER X GOLD, available from CEMEDAINE CO., LTD.) was thinly applied to the electroconductive material 20. The electroconductive material 20 was sandwiched between the insulating elastic bodies 10, 30, and they were adhered.

Thereby, a test piece of an extensible electroconductive wiring material 1 shown in FIGS. 1, 2 was obtained. The insulating elastic bodies 10, 30 made of the silicone rubber had 200 µm in thickness and 42 mm in length of a longitudinal direction. The electroconductive material 20 consisting of the flexible support body 20B which was made of polyimide and had 25 µm in thickness and the electroconductive layer 20A which was applied thereon had 42 mm in length of the longitudinal direction. The insulating elastic bodies 10, 30 had each 1 mm of a margin and 12 mm in width which was along a width direction at right angle of the longitudinal direction.

In the electroconductive material 20:
a minimum wiring width at vent peripheral edge portions 24 was 0.75 mm;
a length of vent holes 23 along the longitudinal direction was 8.5 mm;
a length of vent gaps 22 between the vent peripheral edge portions 24 along the longitudinal direction was 3.5 mm;
a length of the bridge portions along a width direction was 2 mm; and
a repeating length of the vent peripheral edge portions 24 between end portions 21, 26 locating 10 mm from both ends in the longitudinal direction was 22 mm.

Comparative Example 1

A semi-sealed test piece of Comparative example 1 which was produced by merely sticking the electroconductive material 20 and the insulating elastic bodies 10, 30 without adhering was obtained instead of adhering them in Example 1.

Comparative Example 2

A non-sealed test piece of Comparative example 2 consisting of the electroconductive material 20 without using the insulating elastic bodies 10, 30 was obtained instead of employing the insulating elastic bodies 10, 30 in Example 1.
(Characteristics Test 1-1: Resistance Variation and Stress Variation at Stretching Until Breaking)

A stress and a resistance value were measured while both clamped ends of the test piece of the extensible electroconductive wiring material 1 obtained in Example 1 were extended at 0.1 mm/second until breaking it. A graph of FIG. 6(a) shows the relationship between an extension ratio defining no stretching as 0%, and the stress (MPa) and the resistance value (R) at stretching relative to the initial resistance value ($R_0$) by plotting thereof. As clearly seen from FIG. 6(a), the stress was increased with approaching approximately 150% depending on the extension ratio and then not far increased until just before breaking of the test piece thereof. Then, in the test piece of the extensible electroconductive wiring material 1, a resistance value ratio ($R/R_0$) maintained approximately 1.0, which means that good electroconductivity was maintained without variation of the resistance until breaking.
(Characteristics Test 1-2: Resistance Variation and Stress Variation at Stretching and Contracting)

The stress and the resistance value were measured while the both clamped ends of the test piece of the extensible electroconductive wiring material 1 obtained in Example 1 were extended until reaching 150% in the extension ratio, followed by releasing the test piece thereof so as to restore the shape thereof at 0.1 mm/second. A graph of FIG. 6(b) shows the relationship between the extension ratio, and the stress and the resistance value ratio ($R/R_0$) by plotting thereof. A solid line represents hysteresis of extension; and a broken line represents hysteresis of release. As clearly seen from FIG. 6(b), in the test piece of the extensible electroconductive wiring material 1, the shape thereof was completely restored and the resistance value ratio ($R/R_0$) maintained approximately 1.0, which means that good electroconductivity was maintained without variation of the resistance value until breaking.
(Characteristics Test 2-1: Stress in Shape Restoring Characteristics at Stretching and Contracting)

Figure 7:
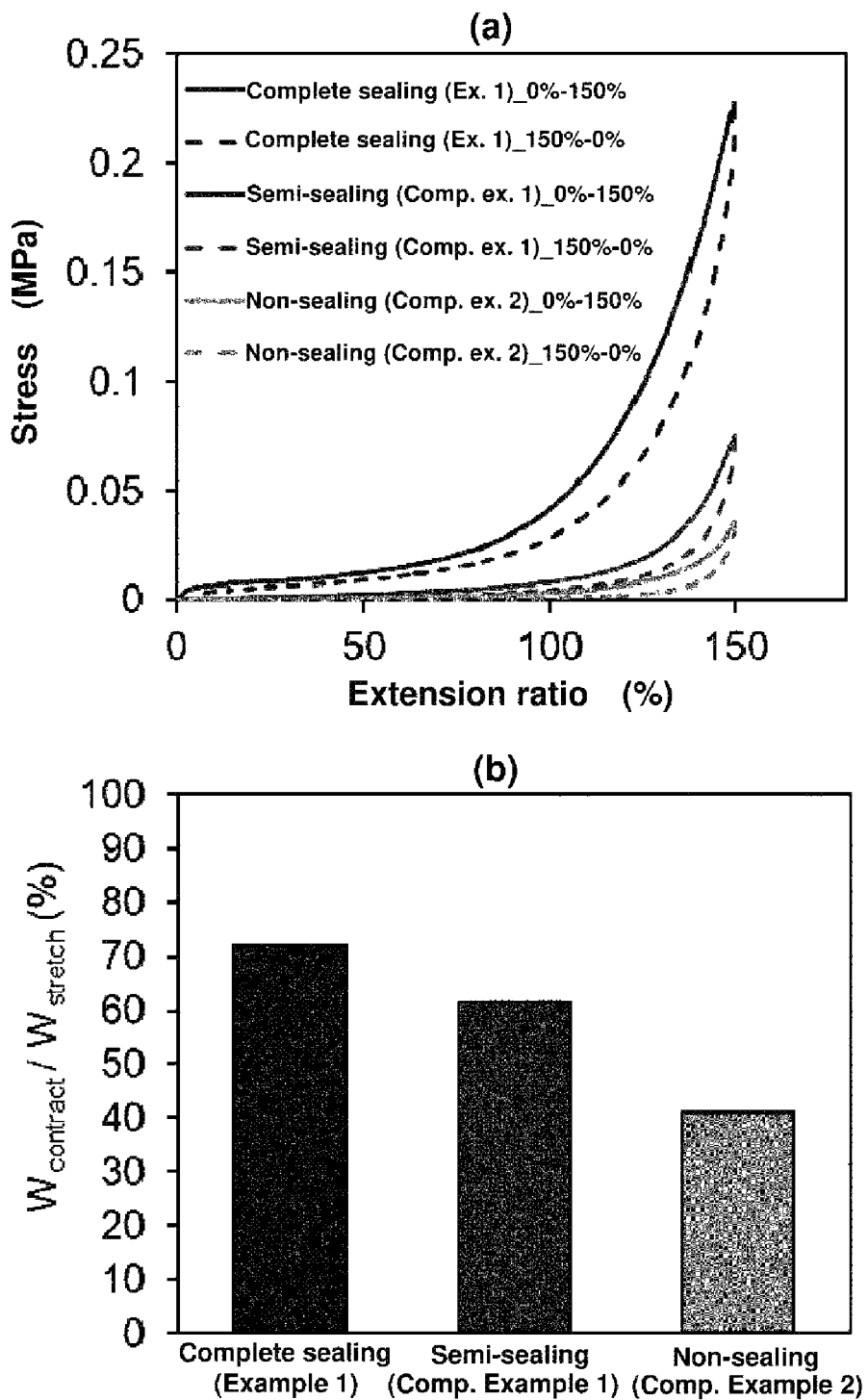
FIG. 7 is a figure of graphs which indicates correlative relationship between an extension ratio and change of stress, and change of an integration ratio of amount of work at stretch time and contraction time of the extensible electroconductive wiring material which applies the present invention and the extensible electroconductive wiring material which does not apply the present invention.

As regards the test piece of the extensible electroconductive wiring material 1 obtained in Example 1 and the test pieces of Comparative examples 1, 2, the extension ratio and the stress were measured in the same manner as "Resistance variation and stress variation at stretching and contracting" in Characteristics test 1-2, followed by plotting them. FIG. 7(a) shows a plotted graph. As clearly seen from FIG. 7(a), in the test piece of the extensible electroconductive wiring material 1 of Example 1 of which the insulating elastic bodies 10, 30 and the electroconductive material 20 were adhered, as the extension ratio increased, high stress was needed. In contrast, according to the test piece of Comparative example 1 which were not adhered and are merely stuck, the stress was not far needed even through the extension ratio increased. It suggests that they were partially separated at the time of the extension and were stuck again at the time of the release. According to the test piece of Comparative example 2 consisting of the electroconductive material, the stress was not far needed even through the extension ratio increased. Thus, the test piece of the extensible electroconductive wiring material 1 obtained in Example 1 indicated that the high stress was needed by synergistic effect of the electroconductive material 20 having the flexible support body 20B and the insulating elastic bodies 10, 30. The test piece of the extensible electroconductive wiring material 1 obtained in Example 1 hardly indicated the stress variation under 0.05 MPa or less until 100% in the extension ratio.
(Characteristics Test 2-2: Hysteresis Loss in Shape Restoring Characteristics at Stretching and Contracting)

In the test piece of the extensible electroconductive wiring material 1 obtained in Example 1 and the test pieces of Comparative examples 1, 2, the extension ratio and the stress were measured in the same manner of "Resistance variation and stress variation at stretching and contracting" in Characteristics test 1-2 as well as Characteristics test 2-1. FIG. 7(b) shows a ratio of an integral value at contracting ($W_{contract}$) of work which is defined as product of a stretching distance and the stress to an integral value at stretching ($W_{stretch}$) thereof. As clearly seen form FIG. 7(b), in the test piece of the extensible electroconductive wiring material 1 of Example 1 of which the insulating elastic bodies 10, 30 and the electroconductive material 20 were adhered, the integral ratio thereof was 70% or more, which exhibits that energy loss is small. The test piece of Comparative example 1 indicated approximately 60% of the integral ratio and emitted approximately 40% of elastic energy as heat. The test piece of Comparative example 2 indicated approximately 40% of the integral ratio and emitted as high as approximately 60% of the elastic energy as the heat. They exhibit that the energy loss is large.
(Characteristics Test 3: Shape Restoring Characteristics at Stretching and Contracting)

The test piece of the extensible electroconductive wiring material 1 obtained in Example 1 and the test piece of Comparative example 2 were stretched at most 150% in the same manner as Characteristics test 1-2. And then, observation of shape change at releasing was performed. The results are shown in FIG. 8. As clearly seen from FIG. 8, the shape of the test piece of the extensible electroconductive wiring material 1 was restored after stretching and contracting. Contrarily, the shape of the test piece of Comparative example 2 kept deforming and was not restored after stretching and contracting.
(Characteristics Test 4-1: Shape Restoring Characteristics and Resistance Value Variation at Repeating of Stretching and Contracting 10 Times)

Figure 9:
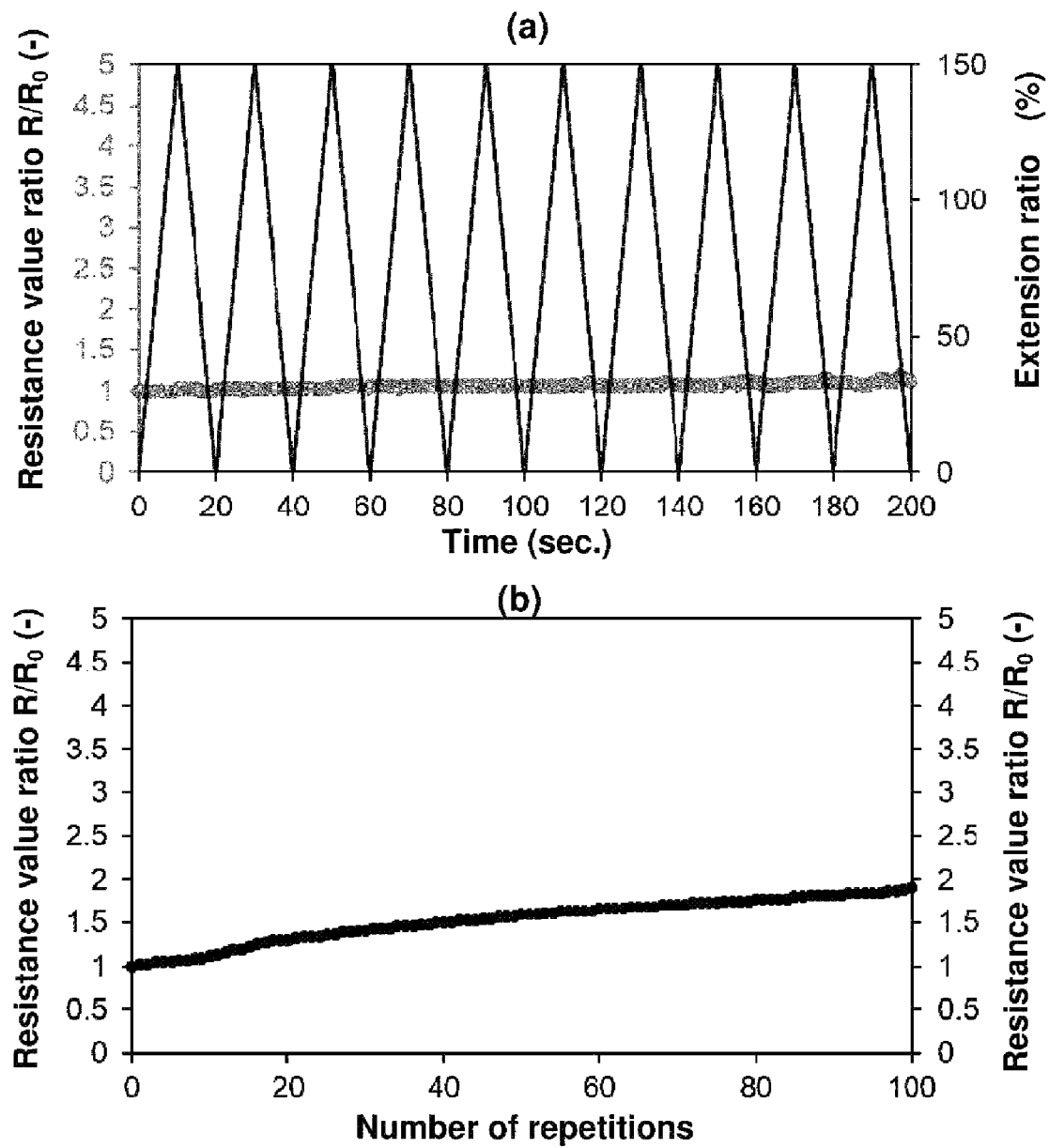
FIG. 9 is a figure of graphs which indicate correlative relationship between elapsed time and change of integration ratio of amount of work under repeat of extension and contraction, and correlative relationship between repeat count and change of integration ratio of amount of work in using the extensible electroconductive wiring material of the present invention.

Tension was gradually applied to the test piece of the extensible electroconductive wiring material 1 obtained in Example 1 for 10 seconds until reaching 150% in the extension ratio, followed by gradually releasing it for 10 seconds. The extension ratio and the resistance value were measured while repeating this test 10 times. FIG. 9(a) is a graph showing the relationship between elapsed time, and the extension ratio and the resistance value ratio ($R/R_0$). As clearly seen from FIG. 9(a), the resistance ratio ($R/R_0$) maintained approximately 1.0 even after the repeating test 10 times. It means that good electroconductivity was maintained without variation of the resistance value until breaking.
(Characteristics Test 4-2: Resistance Value Variation at Repeating of Stretching and Contracting 100 Times)

Tension was gradually applied to the test piece of the extensible electroconductive wiring material 1 obtained in Example 1 for 10 seconds until reaching 150% of the extension ratio, followed by gradually releasing it for 10 seconds. The resistance value was measured while repeating this test 100 times. The resistance was 4.4Ω before stretching and contracting, and was 8.4Ω after repeating 100 times. FIG. 9(b) shows the relationship between a number of repetitions and the resistance value ratio (R/R$_0$). As clearly seen from FIG. 9(b), increasing of the resistance value ratio (R/R$_0$) is merely 1.9 times even after the repeating test of 100 times. The small resistance of 10Ω or less was maintained, which means that repeating of stretching and contracting 100 times hardly affected the electroconductivity. The shape change was 0% before or after repeating of stretching and contracting 100 times.

(Characteristics Test 5: Insulation Property Test)

Figure 10:
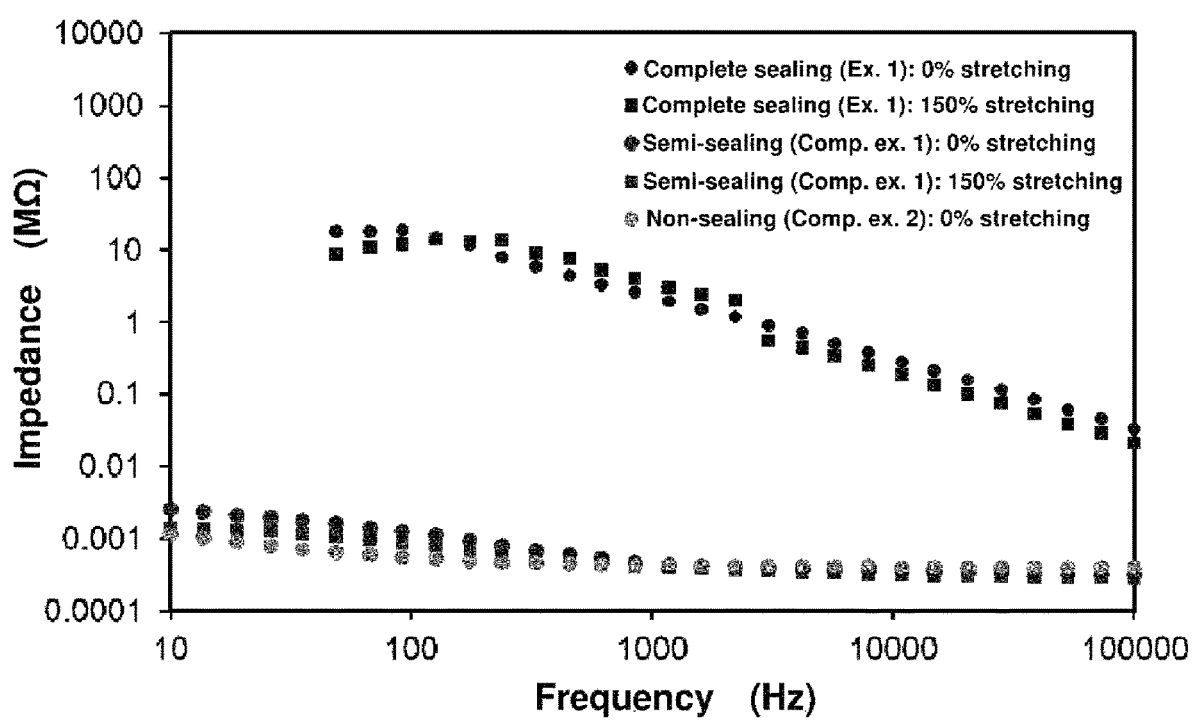
FIG. 10 is a figure of a graph which indicates correlative relationship between frequency and impedance in the extensible electroconductive wiring material of the present invention.

As regards the test piece of the extensible electroconductive wiring material 1 obtained in Example 1, the test piece of Comparative example 1 and the test piece of Comparative example 2, impedance of a non-stretched sample (0% in the extension ratio) and impedance of a stretched sample (150% in the extension ratio) were respectively measured in electrolyte (phosphate buffered saline: PBS). A counter electrode was Ag/AgCl electrode. Frequency was 10 to 100 kHz. The results are shown in FIG. 10. As clearly seen from FIG. 10, when the electroconductive material 20 was completely sealed by the insulating elastic bodies 10, 30 like the test piece of the extensible electroconductive wiring material 1 obtained in Example 1, the whole electroconductive raw material was sealed and thus, insulation was able to be confirmed by the each impedance. The insulation property was able to be maintained in spite of extending or no-extending. It found that a measurement can be performed from 50 Hz to 100 kHz. The extensible electroconductive wiring material 1 of Example 1 can sufficiently bear a measurement of a biological signal because the biological signal, e.g. an electromyographic signal, is approximately 10 MΩ in the vicinity of 100 Hz. Contrarily in the test piece of Comparative example, even if the insulating elastic bodies 10, 30 covered the electroconductive material 20, side faces thereof were exposed. The test piece of Comparative example 2 had non-sealing by insulating elastic bodies. In these cases, it found that accurate datum cannot be obtained in the measurement of the biological signal due to easily picking up noise because no insulation property is totally maintained.

Examples 2a to 2d

Figure 11:
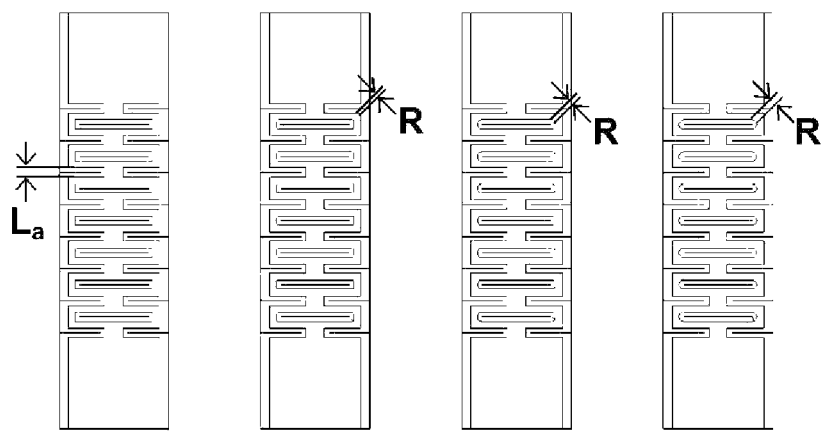
FIG. 11 is a figure which indicates embodiments side by side in the extensible electroconductive wiring material of the present invention having different shapes of corners of various radius dimensions of the vent holes of the electroconductive material.

As shown in following Table 1 and FIG. 11, the extensible electroconductive wiring materials 1 were obtained in the same manner as Example 1 except that a shape of the vent holes 23 of the electroconductive material was a rectangular shape without rounded corners or a rectangular shape having rounded corners. In the rectangular shapes having rounded corners, radius dimensions of respective corners were changed so as to be up to a full R. The resistance variation and the stress variation until breaking at stretching were measured in the same manner as the above Characteristics test 1-1. The results are collectively shown in Table 1.

TABLE 1

| | Vent holes of Electroconductive Material | | | Evaluation of Extensible Electroconductive Wiring Material at Breaking | | |
|---|---|---|---|---|---|---|
| | Shape | Length L$_a$ along Energization Direction (mm) | Radius Dimension R of corner (mm) | Max. Stress (N) | Extension Ratio at Breaking (%) | Extension Ratio at which Resistance Value varies by 10% (%) |
| Ex. 2a (Fig11(a)) | Rectangular Shape without Rounded Corners | 1.00 | 0 | 1.8 | 150 | 130 |
| Ex. 2b (Fig11(b)) | Rectangular Shape having Rounded Corners | 1.00 | 0.20 | 2.6 | 180 | 160 |
| Ex. 2c (Fig11(c)) | Rectangular Shape having Rounded Corners | 1.00 | 0.40 | 2.6 | 180 | 130 |
| Ex. 2d (Fig11(d)) | Rectangular Shape having Rounded Corners | 1.00 | 0.50 | 2.0 | 150 | 130 |

As clearly seen from Table 1, the extensible electroconductive wiring material 1 which has the rectangular shape having the rounded corners (R=0.20, 0.40 and 0.50 mm: having R) exhibited the high maximum stress and the high extension ratio as compared to the extensible electroconductive wiring material 1 which has the rectangular shape without rounded corners (R=0: without R).

However, higher values thereof are not necessarily preferable. The shape having 0.2 mm of the radius dimension of corner 23a with respect to 1 mm in the length L of the vent holes 23 along the energization direction indicated the highest extension ratio and the highest extension ratio at which resistance varies by 10%. The extensible electroconductive wiring material 1 having the radius dimension R=0.5 mm (the full R) with respect to 1 mm in the length L$_a$ of the vent holes along the energization direction indicated that the extension ratio at breaking was lower than the extensible electroconductive wiring materials 1 having the radius dimensions R=0.20 and 0.4 mm, and merely indicated the comparable extension ratio to one of the extensible electroconductive wiring material 1 having the rectangular shape without the rounded corners.

According to these results, it found that the radius dimension of the respective rounded corners 23a of the vent holes 23 in the electroconductive material is preferable less than half of the length $L_a$ of the vent holes 23 along the energization direction.

Examples 3a to 3f

The test pieces of the extensible electroconductive wiring material 1 were obtained in the same as Example 1 except for the following. As shown in following Table 2 and FIG. 12, the shape of the vent holes 23 of the electroconductive material was the rectangle shape without the rounded corners. A ratio of a width $W_b$ between an innermost portion of an inner edge of the vent gaps 22 and an outermost portion of an inner edge of the vent holes 23 to a width $W_a$ of the electroconductive material 20 which was a vertical width direction with respect to the energization direction was changed. The initial resistance value and the stress variation until breaking at stretching were measured in the same manner as Characteristics test 1-1. The results are collectively shown in Table 2.

TABLE 2

|  | Vent Holes of Electroconductive Material | | | Evaluation of Extensible Electroconductive Wiring Material | |
|---|---|---|---|---|---|
|  | Shape | Length $L_a$ along Energization Direction (mm) | Width $W_b$ (mm) | Extension Ratio at Breaking (%) | Initial Resistance ($\Omega$) |
| Ex. 3a (FIG. 12(a)) | Rectangular Shape without Rounded Corners | 1.00 | 1.50 | 90 | 10 |
| Ex. 3b (FIG. 12(b)) | Rectangular Shape without Rounded Corners | 1.00 | 2.50 | 120 | 11 |
| Ex. 3c (FIG. 12(c)) | Rectangular Shape without Rounded Corners | 1.00 | 2.50 | 120 | 9 |
| Ex. 3d (FIG. 12(d)) | Rectangular Shape without Rounded Vomers | 1.00 | 3.50 | 150 | 9 |
| Ex. 3e (FIG. 12(e)) | Rectangular Shape without Rounded Vomers | 1.00 | 4.00 | 180 | 11 |
| Ex. 3f (FIG. 12(f)) | Rectangular Shape without Rounded Vomers | 1.00 | 8.00 | 320 | 36 |

$W_b$: Width between innermost portion of inner edge of the vent gaps and outermost portion of inner edge of the vent holes.

As clearly seen from Table 2, it found the following. The length of the vent holes 23 strongly affects the extension at breaking. The more length thereof is long, the more extension ratio at breaking increases. Contrarily, when the length thereof is excessively long, a way of conduction is also long. The initial resistance therefore would rather increase.

Examples 4a to 4d

Figure 13:
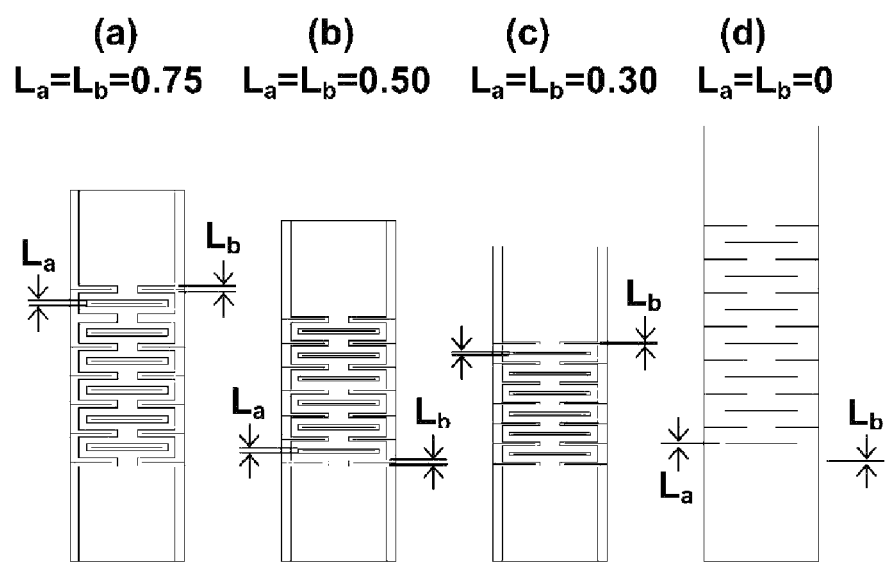
FIG. 13 is a figure which indicates embodiments side by side in the extensible electroconductive wiring material of the present invention having different shapes of the length of the vent hole along the energization direction thereof.

The test pieces of the extensible electroconductive wiring material 1 were obtained in the same as Example 1 except for the following. As shown in following Table 3 and FIG. 13, the shape of the vent holes 23 was the rectangle shape without the rounded corners. The length $L_a$ of the vent holes 23 of the electroconductive material along the energization direction and a length $L_b$ of the vent gaps of the electroconductive material along the energization direction were changed. The resistance variation and the stress variation at stretching until breaking were measured in the same manner as the above Characteristics test 1-1. The results are collectively shown in Table 3.

TABLE 3

|  | Vent Holes/Vent Slits of Electroconductive Material | | Vent Gaps of Electroconductive Material | | Evaluation of Extensible Electroconductive Wiring Material at Breaking | | |
|---|---|---|---|---|---|---|---|
|  | Shape | Length $L_a$ along Energization Direciton (mm) | Shape | Length $L_b$ along Energization Direction (mm) | Max. Stress (N) | Extension Ratio at Breaking | Extension Ratio at which Resistance varies by 10% (%) |
| Ex. 4a (Fig 13(a)) | Vent Holes Rectangular Shape without Rounded Corners | 0.75 | Gaps | 0.75 | 1.8 | 130 | 100 |
| Ex. 4b (Fig 13(b)) | Vent Holes having Rectangular Shape without Rounded Corners | 0.50 | Gaps | 0.50 | 1.5 | 110 | 90 |

TABLE 3-continued

| | Vent Holes/Vent Slits of Electroconductive Material | | Vent Gaps of Electroconductive Material | | Evaluation of Extensible Electroconductive Wiring Material at Breaking | | |
|---|---|---|---|---|---|---|---|
| | Shape | Length $L_a$ along Energization Direciton (mm) | Shape | Length $L_b$ along Energization Direction (mm) | Max. Stress (N) | Extension Ratio at Breaking | Extension Ratio at which Resistance varies by 10% (%) |
| Ex. 4c (Fig 13(c)) | Vent holes having Rectangular shape without Rounded Corners | 0.30 | Gaps | 0.30 | 1.6 | 110 | 90 |
| Ex. 4d (Fig.13(d)) | Vent Slits | 0.00 | Slits | 0.00 | 1.45 | 70 | 60 |

As clearly seen from Table 3, the more length $L_a$ of the vent holes 23 along the energization direction is short, the more maximum stress at breaking tends to decrease. In addition, it is confirmed that the extension ratio and the extension ratio at which the resistance varies by 10% tend to decrease. When the slit shape is totally employed instead of the vent holes 23 and the vent gaps are changed to the slit shape, characteristics relating to stretching and contracting clearly and further decrease. Accordingly, it is suggested that the opening structure like the vent holes 23 is important in order to obtain high stretching and contracting characteristics.

Example 5 and Comparative Example 3

As shown in following Table 4 and FIG. 14, the test piece of the extensible electroconductive wiring material 1 (Example 5) was obtained in the same manner as Example 1. A test piece of an extensible electroconductive wiring material (Comparative example 3) was obtained in the same manner as Example 1 except for without insulating elastic bodies. (Characteristics Test 6: Shape Restoring Characteristics at Stretching and Contracting)

The test piece of the extensible electroconductive wiring material 1 obtained in Example 5 and the test piece of Comparative example 2 were stretched until reaching 45 to 67.5 mm. And then, observation of shape change at releasing was performed. The results are shown in Table 4 and FIG. 14.

TABLE 4

| | Extensible Electroconductive Wiring Material | | | | |
|---|---|---|---|---|---|
| | Shape | Length $L_a$ along Energization Direction (mm) | Stretching of Extensible Electroconductive Wiring Material | | |
| | | | before Stretching | in Stretching | after Releasing |
| Ex. 5 (FIG. 14(a)) | Having Insulating Elastic bodies | 0.75 | Not Deformed | Normally Extended | Completely Restored (Deformation ratio 0%) |
| Comp. ex. 3 (FIG. 14(b)) | Without Insulating Elastic bodies | 0.50 | Not Deformed | Normally Extended | Restored with Deforming (Deformation ratio 15%) |

As clearly seen from Table 4 and FIG. 14, when rubber-sealing by the insulating elastic bodies is lacked, permanent deformation is incurred in stretching one after releasing stress at the time of stretching and thus, a deformation ratio is high. In addition, since it is deformed and remains in stretching, it can be extended by a weaker force at being stretched again and thus, extensibility is insufficient.

Example 6: Application Example to Wearable Device

Figure 15:
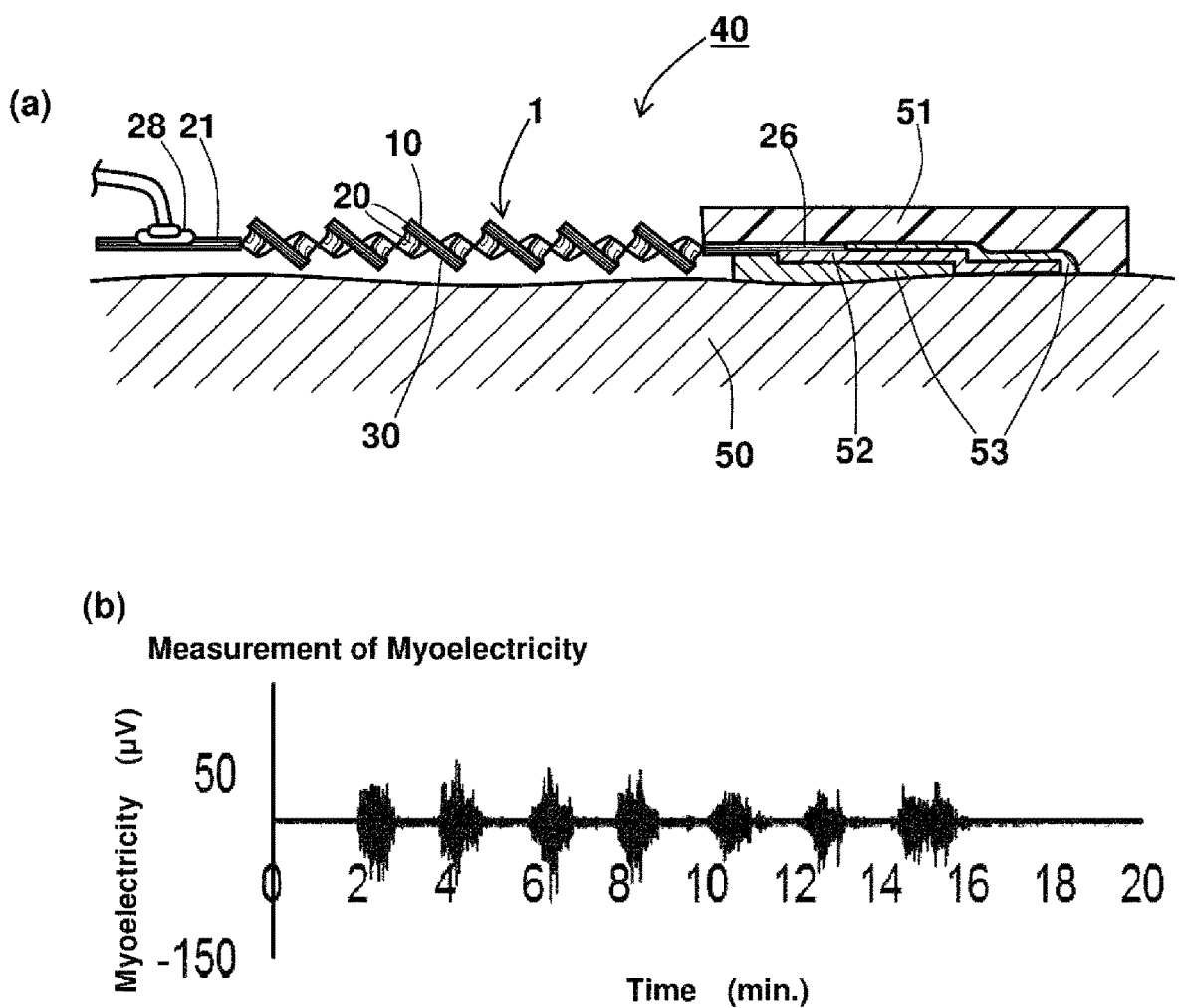
FIG. 15 is a figure of a schematic view which indicates the extensible electroconductive wiring material of the present invention, and a graph which indicates correlative relationship between elapsed time and myopotential measured by using it.

A couple of the extensible electroconductive wiring materials 1 was obtained in the same manner as Example 1 except that the insulation elastic bodies 10, 30 were shortened and the electroconductive material was exposed at the end portions 21, 26 locating on 10 mm from the both ends in the longitudinal direction. The couple of the extensible electroconductive wiring material 1 was used for electrodes of a wearable device instead of the extensible electroconductive wiring materials 1 of Example 1. As shown in FIG. 15(a), a ring snap terminal 28 was screwed and swaged at the one end portion 21 into for connecting to an external device. The other end portion 26 was connected to an electrode terminal 52 for measurement of myoelectricity while being covered with a urethane film 51. As shown in FIG. 15(a), a gluing agent 53 was applied on a surface of a skin side of the urethane film 51, and the electrode terminal 52 for measurement of myoelectricity was directly stuck along the muscles of the ball of the thumb. Thus the electrode terminal 52 of the extensible electroconductive wiring module 40 was used as an electrode of a pair of the electrodes. The myoelectricity (sEMG) of a thenar eminence in bending a thumb at intervals of approximately 2 seconds was measured. The results are shown in FIG. 15(b). As shown in FIG. 15(b), as the wearable device, the extensible electroconductive wiring module 40 was able to detect a movement of the thenar eminence in bending the thumb as electromyogram by stretching and contracting the extensible electroconductive wiring material 1.

INDUSTRIAL APPLICABILITY

Since the extensible electroconductive wiring material has flexibility, high insulation property and excellent durability, and occurs no decrease of extensibility by repeating of stretching and contracting while having sufficient extensibility, it is utilized for the wiring material of the extensible electroconductive wiring module which needs stretching and contracting.

The extensible electroconductive wiring module is used for a robots and flexible devices such as a wearable device and a flexible board which need an extensible wire.

EXPLANATIONS OF LETTERS OR NUMERALS

Numerals mean as follows. 1: extensible electroconductive wiring material, 10: insulating elastic body, 11: end portion, 12: gap slit, 13: penetration slit, 16: end portion, 20: electroconductive material, 20A: electroconductive layer, 20B: flexible support body, 21: end portion, 22: vent gap, 23: vent hole, 23a: corner, 23b: liner portion, 24: vent peripheral edge portion, 25: bridge portion, 26: end portion, 27: penetration pinhole, 28: connection connector, 29: connection cord, 30: insulating elastic body, 31: end portion, 32: gap slit, 33: penetration slit, 36: end portion, 40: extensible electroconductive wiring module, 50: skin of object person for measurement, 51: urethane film, 52: electrode terminal, 53: adhesive, $W_a$: width of electroconductive material, $W_a$: width between innermost position of vent gap of electroconductive material and outermost position of vent hole, $L_a$: length of vent hole along energization direction, $L_b$: length of vent gap along energization direction, R: radius dimension of corner.

What is claimed is:

1. An extensible electroconductive wiring material comprising a flexible electroconductive material and insulating elastic bodies,
wherein
the flexible electroconductive material having an electroconductive layer has vent peripheral edge portions in which vent holes and/or vent slits are penetrated and aligned in series and/or in parallel along an energization direction of the electroconductive layer while the vent peripheral edge portions are energizably linked, and the vent peripheral edge portions is sealed and covered by the insulating elastic bodies so as not to be exposed; and
the insulating elastic bodies have penetration slits and/or penetration holes which penetrate therethrough while matching the vent peripheral edge portions and are smaller than the vent holes and the vent slits.

2. The extensible electroconductive wiring material according to claim 1,
wherein the electroconductive material has vent gaps, which are respectively cut from both of longitudinal sides to central or from one side to the other side of the electroconductive material between the adjacent plurality of the vent peripheral edge portions, and
the insulating elastic bodies have gap slits, gap incisions and/or gap holes which are smaller than the vent gap and penetrate therethrough while matching the vent gaps.

3. The extensible electroconductive wiring material according to claim 1, wherein the extensible electroconductive wiring material have a shape of a square rectangle or a shape of a round rectangle.

4. The extensible electroconductive wiring material according to claim 1, wherein each radius dimension of rounded corners of the vent holes of the electroconductive material is less than half of a length of the vent holes along the energization direction.

5. The extensible electroconductive wiring material according to claim 1, wherein a width between an innermost position of an inner edge of the vent gaps and an outermost position of an inner edge of the vent holes relative to a width of a width direction being perpendicular to the energization direction, is ranging from 1:1 to 1:20.

6. The extensible electroconductive wiring material according to claim 1, wherein a length along the energization direction of the vent holes of the electroconductive material is at least 0.3 mm.

7. The extensible electroconductive wiring material according to claim 1, wherein the electroconductive material has the electroconductive layer on a flexible support body.

8. The extensible electroconductive wiring material according to claim 1, wherein both sides of the electroconductive material are sealed and covered by the insulating elastic bodies while covering at least the vent peripheral edge portions.

9. The extensible electroconductive wiring material according to claim 1, wherein the electroconductive layer is a metallic foil layer, an organic conducting layer and/or a conducting layer including a conductive inorganic substance.

10. The extensible electroconductive wiring material according to claim 1, wherein the electroconductive layer is flexible and made from a non-stretchy substance.

11. The extensible electroconductive wiring material according to claim 1, wherein the insulating elastic bodies are made from silicone resin, silicone rubber, polyurethane, a thermoplastic elastomer, ethylene-propylene rubber, or fluorine-contained rubber.

12. The extensible electroconductive wiring material according to claim 11, wherein the flexible support body is an insulating flexible support body made from polypropylene, polyethylene, polyethylene terephthalate, polycarbonate, polyacetal, polyamide, polyimide, polyether ether ketone, or polyphenylene sulfide.

13. The extensible electroconductive wiring material according to claim 11, wherein the vent holes, the penetration holes and/or the vent peripheral edge portions have rounded corners respectively, and/or the vent slits and/or the penetration slits have penetration pinholes at terminals thereof.

14. The extensible electroconductive wiring material according to claim 2, wherein the vent gaps have rounded corners respectively.

15. The extensible electroconductive wiring material according to claim 1, wherein the electroconductive material has electric connectors at terminals of the electroconductive layer.

16. An extensible electroconductive wiring module comprising a plurality of the extensible electroconductive wiring materials according to claim 1.

17. The extensible electroconductive wiring module according to claim 16, wherein the plurality of the extensible electroconductive wiring materials is overlapped and integrated.

18. The extensible electroconductive wiring module according to claim 16, wherein the plurality of the extensible electroconductive wiring material has exposed terminals at respective terminal positions of the electroconductive layers each other, or connects external terminals at respective terminal positions thereof.

19. The extensible electroconductive wiring module according to claim 16, wherein the plurality of the extensible electroconductive wiring materials is a pair or multiple pairs of electrodes.

* * * * *